US012575077B2

(12) United States Patent
Lee et al.

(10) Patent No.: US 12,575,077 B2
(45) Date of Patent: Mar. 10, 2026

(54) SEMICONDUCTOR MEMORY DEVICE

(71) Applicant: Samsung Electronics Co., Ltd.,
Suwon-si (KR)

(72) Inventors: Minjun Lee, Suwon-si (KR); Yongseok Kim, Suwon-si (KR); Hyuncheol Kim, Suwon-si (KR); Mintae Ryu, Suwon-si (KR); Yongjin Lee, Suwon-si (KR)

(73) Assignee: Samsung Electronics Co., Ltd.

( * ) Notice: Subject to any disclaimer, the term of this patent is extended or adjusted under 35 U.S.C. 154(b) by 577 days.

(21) Appl. No.: 18/175,445

(22) Filed: Feb. 27, 2023

(65) Prior Publication Data

US 2023/0328950 A1 Oct. 12, 2023

(30) Foreign Application Priority Data

Apr. 1, 2022 (KR) ........................ 10-2022-0040983

(51) Int. Cl.
H10B 12/00 (2023.01)
(52) U.S. Cl.
CPC .................................. H10B 12/00 (2023.02)
(58) Field of Classification Search
CPC ...................................................... H10B 12/00
See application file for complete search history.

(56) References Cited

U.S. PATENT DOCUMENTS

| | | | |
|---|---|---|---|
| 7,983,070 B2 | 7/2011 | Forbes | |
| 8,941,173 B2 | 1/2015 | Han et al. | |
| 9,508,854 B2 | 11/2016 | Biswas et al. | |
| 9,728,539 B2 | 8/2017 | Choi et al. | |
| 10,553,708 B2 | 2/2020 | Balakrishnan et al. | |
| 10,854,617 B2 | 12/2020 | Derner et al. | |
| 10,892,264 B2 | 1/2021 | Pulugurtha et al. | |
| 10,910,385 B2 | 2/2021 | Zhang | |
| 11,094,697 B2 | 8/2021 | Yang et al. | |
| 2009/0294833 A1 | 12/2009 | Kim | |
| 2011/0215391 A1* | 9/2011 | Takaishi | H01L 21/76224 257/334 |
| 2018/0197864 A1 | 7/2018 | Sills | |
| 2023/0377635 A1* | 11/2023 | Sakui | G11C 11/4085 |
| 2024/0074140 A1* | 2/2024 | Kakumu | G11C 11/4096 |

FOREIGN PATENT DOCUMENTS

KR 101085155 B1 11/2011

* cited by examiner

*Primary Examiner* — Richard A Booth
(74) *Attorney, Agent, or Firm* — Fish & Richardson P.C.

(57) ABSTRACT

A semiconductor memory device includes a plurality of memory cells arranged on a substrate. Each of the plurality of memory cells may include a first transistor on the substrate and a second transistor on the first transistor. The first transistor may include a first channel region between a first source region and a first drain region, a first gate electrode, and a first gate insulating layer. The second transistor may include a pillar structure having a second drain region, a second channel region and a second source region sequentially stacked on the first gate electrode, a second gate electrode on one side of the second channel region, and a second gate insulating layer between the second channel region and the second gate electrode. the second drain region and the second source region may have a first conductivity type impurity region and a second conductivity type impurity region, respectively.

20 Claims, 34 Drawing Sheets

100A

SEMICONDUCTOR MEMORY DEVICE

CROSS-REFERENCE TO RELATED APPLICATION(S)

This application claims the benefit under 35 U.S.C. § 119(a) of Korean Patent Application No. 10-2022-0040983, filed on Apr. 1, 2022 in the Korean Intellectual Property Office, the entire disclosure of which is incorporated herein by reference for all purposes.

BACKGROUND

Inventive concepts relate to a semiconductor memory device.

As electronic products become lighter, thinner and smaller, demand for high integration of semiconductor memory devices is increasing. Due to the high integration, the size of elements (e.g., transistors) constituting the semiconductor memory device also may be reduced and leakage current may increase. Accordingly, there may be a need to improve performance and reliability of a semiconductor memory device by controlling leakage current.

SUMMARY

Some example embodiments provide a semiconductor memory device having improved reliability and performance by controlling leakage current.

According to an example embodiment, a semiconductor memory device includes a substrate, a plurality of first transistors on the substrate, a plurality of second transistors, a plurality of power lines, a plurality of first bit lines, a plurality of second bit lines, and a plurality of word lines. The plurality of first transistors may be arranged in a first direction and a second direction. The first direction and the second direction may be parallel to an upper surface of the substrate. The first direction and the second direction may intersect each other. The plurality of first transistors each may include a first source region, a first drain region, a first channel region between the first source region and the first drain region, and a first gate electrode on the first channel region. The plurality of second transistors each may include a pillar structure and a second gate electrode. The pillar structure may be on the first gate electrode of a corresponding one of the plurality of first transistors. The pillar structure may include a second drain region, a second channel region, and a second source region sequentially stacked on the first gate electrode of the corresponding one of the plurality of first transistors. The second gate electrode may be on one side of the second channel region. The second drain region and the second source region may have a first conductivity type impurity region and a second conductivity type impurity region, respectively. The plurality of power lines may be connected to respective first source regions of the plurality of first transistors. The plurality of power lines may extend in the first direction. The plurality of first bit lines may be connected to respective first drain regions of the plurality of first transistors. The plurality of first bit lines may extend in the first direction. The plurality of second bit lines may be connected to respective second source regions of the plurality of second transistors. The plurality of second bit lines may extend in the first direction. The plurality of word lines may connect respective second gate electrodes of the plurality of second transistors. The plurality of word lines may extend in the second direction.

According to an example embodiment, a semiconductor memory device may include a substrate; and a plurality of memory cells on the substrate. Each of the plurality of memory cells may include a first transistor on the substrate and a second transistor on the first transistor. The first transistor may include a first source region, a first drain region, a first channel region between the first source region and the first drain region, a first gate electrode on the first channel region, and a first gate insulating layer between the first channel region and the first gate electrode. The second transistor may include a pillar structure on the first gate electrode of the first transistor. The pillar structure may include a second drain region, a second channel region, and a second source region sequentially stacked on the first gate electrode of the first transistor. The second transistor may include a second gate electrode on one side of the second channel region, and a second gate insulating layer between the second channel region and the second gate electrode. The second drain region and the second source region may have a first conductivity type impurity region and a second conductivity type impurity region, respectively.

According to an example embodiment, a semiconductor memory device may include a substrate including a plurality of recesses, a plurality of first transistors on the substrate, a plurality of second transistors, a plurality of power lines, a plurality of first bit lines, a plurality of second bit lines, and a plurality of word lines. The plurality of first transistors may be arranged in a first direction and a second direction. The first direction and the second direction may be parallel to an upper surface of the substrate and intersecting each other. The plurality of first transistors each may include a first source region and a first drain region on opposite sides, respectively, in the second direction of a corresponding recess among the plurality of recesses, a first channel region along a surface of the corresponding recess, and a first gate electrode on the first channel region. The plurality of second transistors each may include a pillar structure and a second gate electrode. The pillar structure may be on the first gate electrode of a corresponding one of the plurality of first transistors. The pillar structure may include a second drain region, a second channel region, and a second source region stacked in a third direction on the first gate electrode of the corresponding one of the plurality of first transistors. The third direction may be perpendicular to the upper surface of the substrate. The second gate electrode may be on one side of the second channel region. The second drain region and the second source region may have a first conductivity type impurity region and a second conductivity type impurity region, respectively. The plurality of power lines may be connected to respective first source regions of the plurality of first transistors. The plurality of power lines may extend in the first direction. The plurality of first bit lines may be connected to respective first drain regions of the plurality of first transistors. The plurality of first bit lines may extend in the first direction. The plurality of second bit lines may be connected to respective second source regions of the plurality of second transistors. The plurality of first bit lines may extend in the first direction. The plurality of word lines may connect the respective second gate electrodes of the plurality of second transistors. The plurality of word lines may extend in the second direction.

BRIEF DESCRIPTION OF DRAWINGS

The above and other aspects, features, and advantages of inventive concepts will be more clearly understood from the following detailed description, taken in conjunction with the accompanying drawings, in which:

FIGS. 11A to 20A are plan views for respective main processes, illustrating a method of manufacturing a semiconductor memory device according to an example embodiment, and FIGS. 11B to 20B and FIGS. 11B to 20C are cross-sectional views of the semiconductor memory device in FIGS. 11A to 20A, taken along lines I-I' and II-II', respectively.

DETAILED DESCRIPTION

Hereinafter, example embodiments will be described with reference to the accompanying drawings.

Figure 1:
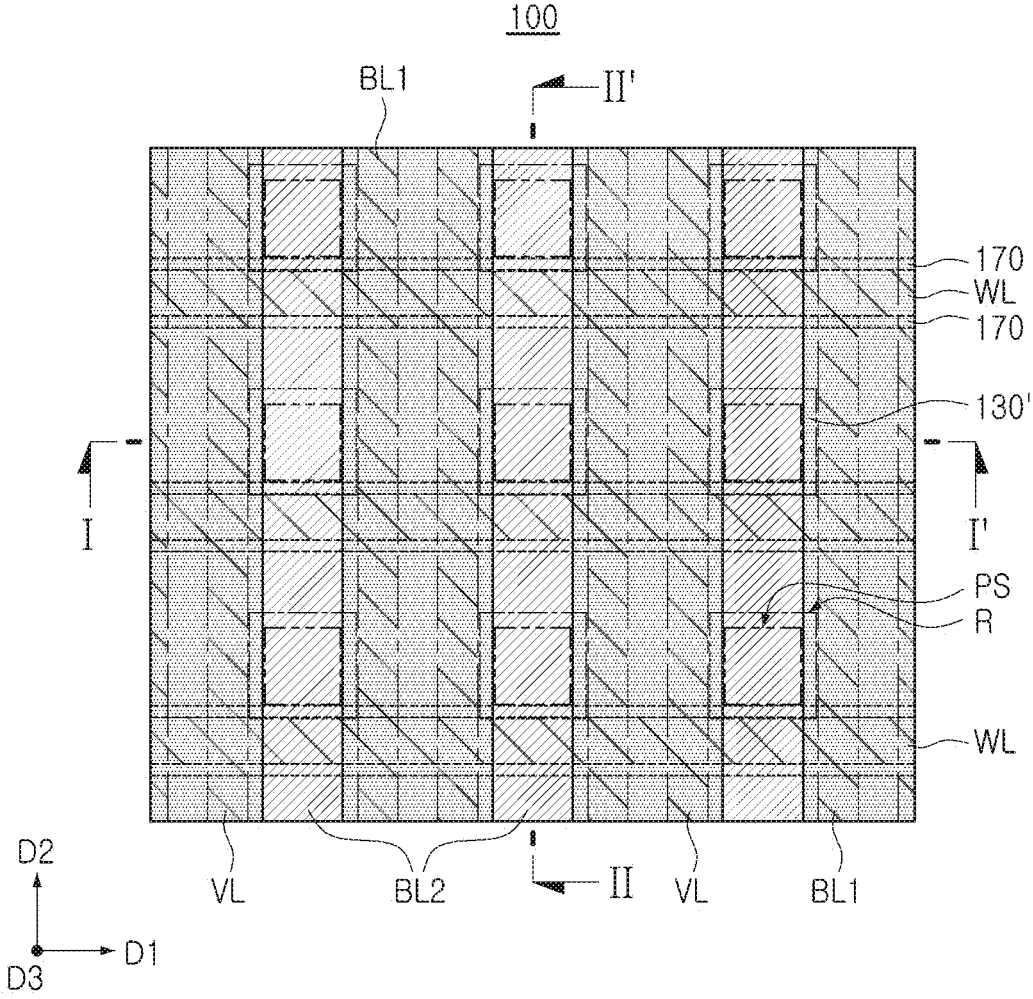
FIG. 1 is a plan view illustrating a semiconductor memory device according to an example embodiment.
Figure 2A:
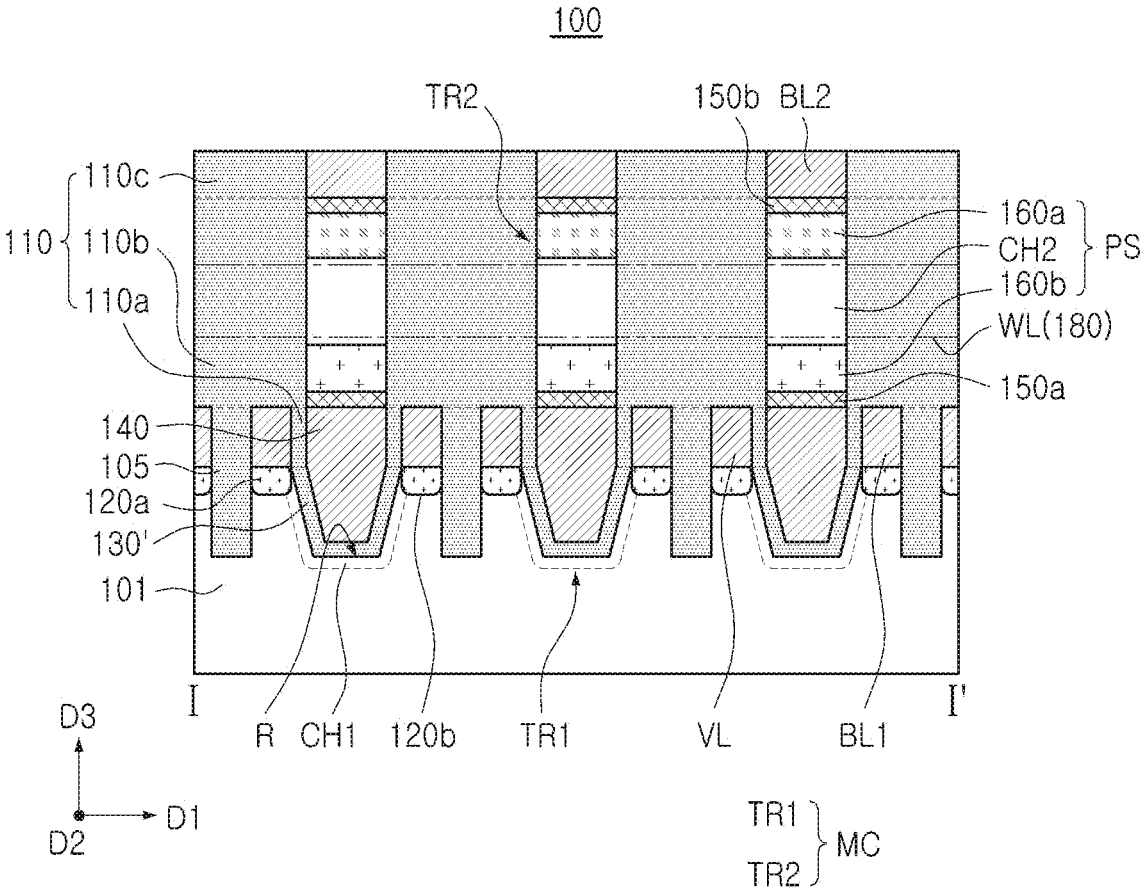
FIGS. 2A and 2B are cross-sectional views of the semiconductor memory device of FIG. 1 taken along lines I-I' and II-II', respectively.
Figure 2B:
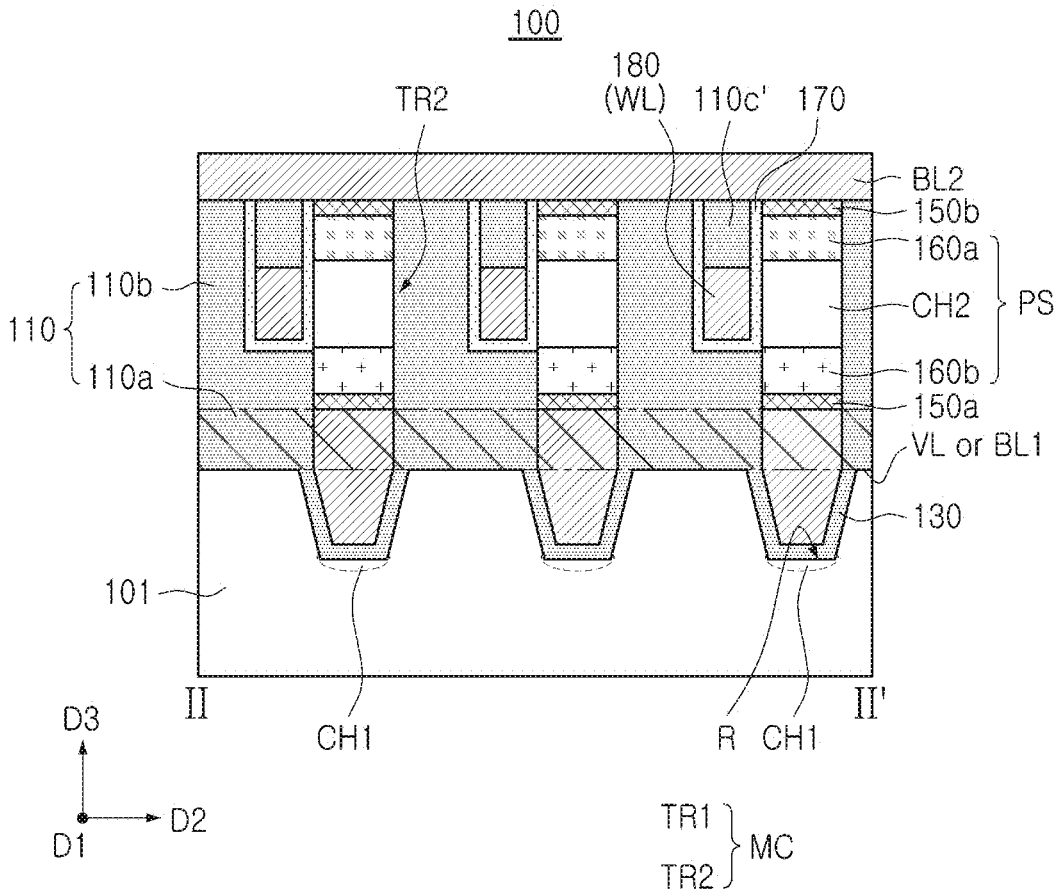

FIG. 1 is a plan view illustrating a semiconductor memory device according to an example embodiment, and FIGS. 2A and 2B are cross-sectional views of the semiconductor memory device of FIG. 1 taken along lines I-I' and II-II', respectively.

Referring to FIGS. 1, 2A and 2B, a semiconductor memory device 100 according to an example embodiment includes a plurality of memory cells MC repeatedly arranged on a substrate 101, in a first direction D1 and a second direction D2 parallel to the upper surface of the substrate 101 and intersecting each other.

The plurality of memory cells MC employed in this embodiment have a Dynamic Random Access Memory (DRAM) structure comprised of two transistors, and each include a first transistor TR1 and a second transistor TR2 stacked in a third direction D3 perpendicular to the upper surface of the substrate 101. The semiconductor memory device 100 may include an interlayer insulating layer 110 disposed on the substrate 101 and surrounding the plurality of memory cells MC.

The interlayer insulating layer 110 employed in this embodiment may include a first interlayer insulating layer 110a surrounding the plurality of first transistors TR1, a second interlayer insulating layer 110b disposed on the first interlayer insulating layer 110a and surrounding the plurality of second transistors TR2, and a third interlayer insulating layer 110c disposed on the second interlayer insulating layer 110b and surrounding a second bit line BL2.

The first transistor TR1 may include a first source region 120a and a first drain region 120b on the substrate 101, and a first channel region CH1 between the first source region 120a and the first drain region 120b. The first channel region CH1 may have a three-dimensional channel structure. In the present embodiment, the first channel region CH1 may have a curved structure along the surface of a recess R. The bottom surface of the recess R is illustrated as having an angular shape, such as an inverted trapezoid in cross section, but may have a "U" shape.

The first source region 120a and the first drain region 120b may be disposed on the upper surface of the substrate 101 positioned on both sides of the recess R in the second direction D2. For example, the first transistor TR1 may be an n-channel MOSFET. In detail, each of the first source region 120a and the first drain region 120b may be a high-concentration n-type impurity region. The substrate region provided as the first channel region CH1, around the recess R, may be a low-concentration p-type impurity region.

In some embodiments, the substrate 101 may include a group IV semiconductor, a group III-V compound semiconductor, or a group II-VI compound semiconductor. For example, the group IV semiconductor may include silicon, germanium, or silicon-germanium. In some embodiments, the substrate 101 may be a p-type semiconductor substrate or a semiconductor substrate having a p-type well.

A device isolation layer 105 may include trenches formed in the second direction D2 to separate columns of the first transistor TR1 from each other in the second direction D2 in the substrate 101. The device isolation layer 105 may include an insulating material filled in the trenches. For example, the insulating material may include silicon oxide, silicon oxynitride, silicon nitride, or combinations thereof.

The first transistor TR1 further include a first gate electrode 140 disposed on the first channel region CH1, and a first gate insulating layer 130' disposed between the first channel region CH1 and the first gate electrode 140.

The first gate insulating layer 130' may include, for example, silicon oxide, silicon oxynitride, silicon nitride, or a high-k material. For example, the high-k material may be silicon nitride, aluminum oxide, zirconium oxide (ZrO), hafnium oxide (HfO), lanthanum oxide (LaO), or yttrium oxide (YO). In some embodiments, the first gate insulating layer 130' may include a plurality of different dielectric layers.

In this embodiment, the first gate insulating layer 130' may include the same material as a material of the first interlayer insulating layer 110a. For example, the first gate insulating layer 130' and the first interlayer insulating layer 110a may be formed of silicon oxide. In another embodiment, the first gate insulating layer 130' may include a material different from a material of the first interlayer insulating layer 110a. For example, the first interlayer insulating layer 110a may be silicon oxide, and the first gate insulating layer 130' may be at least one of silicon nitride, aluminum oxide, zirconium oxide (ZrO), hafnium oxide (HfO), lanthanum oxide (LaO) and yttrium oxide (YO).

The first gate electrode 140 may have a portion disposed in the recess R. The first gate electrodes 140 may be arranged in various manners according to the circuit configuration of the semiconductor device 100. In the present example embodiment, the first gate electrodes 140 may be disposed to be separated from each other in units of each memory cell MC. The first gate electrodes 140 may also be separately formed to be separated from each other in the first transistors in the same column.

The first gate electrode 140 may include a conductive material. For example, the first gate electrode 140 may include a metal nitride such as titanium nitride (TiN), tantalum nitride (TaN), or tungsten nitride (WN), and/or a metallic material such as aluminum (Al), tungsten (W), or molybdenum (Mo), or a semiconductor material such as doped polysilicon. In some embodiments, the first gate electrode 140 may include two or more multiple layers.

The second transistor TR2 may have a structure of a vertical channel transistor disposed on the first transistor TR1. The second transistor TR2 may include a pillar structure PS extending in a third direction D3 perpendicular to the upper surface of the substrate 101. The pillar structure PS may include a second drain region 160*b*, a second channel region CH2, and a second source region 160*a* sequentially stacked on the first gate electrode 140.

The pillar structure PS may be a structure based on the same material, grown in the third direction D3. In some embodiments, the pillar structure PS may include a semiconductor material such as polysilicon. Alternatively, the pillar structure PS may be $CuS_2$, $CuSe_2$, $WSe_2$, $MoS_2$, $MoSe_2$, $WS_2$, IZO, ZTO, YZO, or IGZO. In a specific embodiment, the pillar structure PS may include transition metal dichalcogenide (TMD) or molybdenite.

The second transistor TR2 employed in this embodiment may be implemented in a tunneling field effect transistor (FET) structure to reduce leakage current.

The second drain region 160*b* of the pillar structure PS may be the same first conductivity type impurity region as the first source region 120*a* and the first drain region 120*b* of the first transistor TR, and the second source region 160*a* of the pillar structure PS may be a second conductivity type impurity region. Also, a second channel region CH2 between the second source region 160*a* and the second drain region 160*b* may be an intrinsic region.

The second transistor TR2 may include a second gate electrode 180 disposed on one side of the second channel region CH2, and a second gate insulating layer 170 disposed between the second channel region CH2 and the second gate electrode 180.

The second gate insulating layer 170 employed in this embodiment may have a structure extending from one side of the second gate electrode 180 facing the second channel region CH2 to the other side of the second gate electrode 180, across the lower surface of the second gate electrode 180. The second gate electrode 180 may have a width substantially corresponding to a height of the second channel region CH2. On the second gate electrode 180, a portion 110*c'* filled with the same material as the third interlayer insulating layer 110*c* may be located as a portion of the third interlayer insulating layer 110*c* (See FIGS. 19C and 20C).

The second gate insulating layer 170 may include the same or similar material as the first gate insulating layer 130'.

The second gate insulating layer 170 may include, for example, silicon oxide, silicon oxynitride, silicon nitride, or a high-k material. For example, the high-k material may be silicon nitride, aluminum oxide, zirconium oxide (ZrO), hafnium oxide (HfO), lanthanum oxide (LaO), or yttrium oxide (YO). In some embodiments, the second gate insulating layer 170 may include a plurality of different dielectric layers.

In this embodiment, the second gate insulating layer 170 may include a material different from a material of the second interlayer insulating layer 110*b*. For example, the second interlayer insulating layer 110*b* may be silicon oxide, and the second gate insulating layer 170 may be at least one of silicon nitride, aluminum oxide, zirconium oxide (ZrO), hafnium oxide (HfO), lanthanum oxide (LaO), and yttrium oxide (YO). In another embodiment, the second gate insulating layer 170 may include the same material as a material of the second interlayer insulating layer 110*b*. For example, the second gate insulating layer 170 and the second interlayer insulating layer 110*b* may be formed of silicon oxide.

The second gate electrode 180 may include the same or similar material as the first gate electrode 140. The second gate electrode 180 may include a conductive material. For example, the second gate electrode 180 may include a metal nitride such as titanium nitride (TiN), tantalum nitride (TaN), or tungsten nitride (WN), and/or a metal material such as aluminum (Al), tungsten (W) or molybdenum (Mo), or a semiconductor material such as doped poly-silicon. In some embodiments, the second gate electrode 180 may include two or more multiple layers.

In the present embodiment, the second gate electrodes 180 of the second transistor TR2 arranged in the second direction D2 may be connected to each other by word lines WL extending in the second direction D2, respectively. In addition, the second gate electrodes 180 in the same column may have an integrated structure with the corresponding word line WL. In detail, the second gate electrodes 180 may be formed of the same material using the same process as the process of the corresponding word line WL. For example, the second gate electrodes 180 and the word line WL may be formed of a conductive material such as tungsten by the same process (please refer to FIGS. 19A, 19B, and 19C).

In the present embodiment, the semiconductor memory device 100 may include a first connection electrode layer 150*a* disposed between the first gate electrode 140 and the pillar structure PS (in detail, the second drain region 160*b*), and a second connection electrode layer 150*b* respectively disposed between the pillar structure PS (in detail, the second source region 160*a*) and the second bit line BL2. The first and second connection electrode layers 150*a* and 150*b* may respectively form an ohmic contact between metal elements (the first gate electrode 140 and the second bit line BL2) different from the second drain region 160*b* and the second source region 160*a* of the second transistor TR2. In some embodiments, when the pillar structure PS includes polysilicon, the first and second connection electrode layers 150*a* and 150*b* may each include silicide.

Referring to FIGS. 1, 2A, and 2B, the semiconductor memory device 100 may include a plurality of power lines VL connected to the first source region 120*a* of each of the plurality of first transistors TR1 and extending in the first direction D1, and a plurality of first bit lines BL1 connected to the first drain region 120*b* of each of the plurality of first transistors TR1 and extending in the first direction D1. In addition, the semiconductor memory device 100 may include a plurality of second bit lines BL2 connected to the second source region 160*a* of each of the plurality of second transistors TR2 and extending in the first direction D1, and a plurality of word lines WL connected to the second gate electrode 180 of each of the plurality of second transistors TR2 and extending in the second direction D2.

As described above, each of the plurality of memory cells MC may constitute a DRAM cell including the first and second transistors TR1 and TR2, and the gate electrode 140 of the first transistor TR1 and the drain region 160*b* of the second transistor TR2 may be electrically connected.

Figure 3:
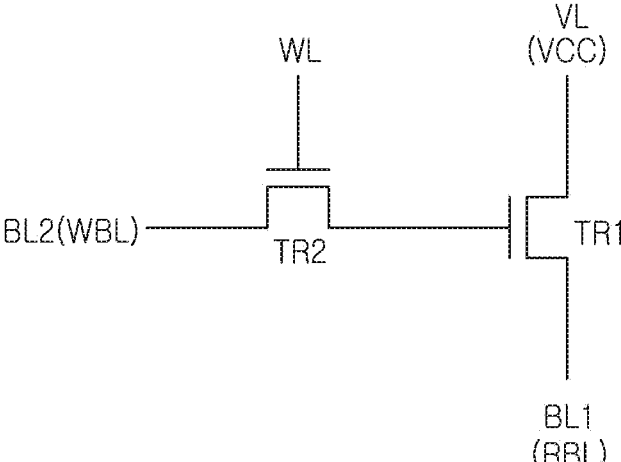
FIG. 3 is an equivalent circuit diagram of a memory cell employed in the semiconductor memory device of FIG. 1.

FIG. 3 is an equivalent circuit diagram of a memory cell employed in the semiconductor memory device of FIG. 1.

Referring to FIG. 3, the gate (e.g., the second gate electrode 180) of the second transistor TR2 is connected to the word line WL, and the source (e.g., the second source region 160a) of the second transistor TR2 is connected to the second bit line BL2 for writing. The drain (e.g., the second drain region 160b) of the second transistor TR2 is connected to the gate (e.g., the first gate electrode 140) of the first transistor TR1, the source (e.g., the first source region 120a) of the first transistor TR1 is connected to the power line VL, and the drain (e.g., the first drain region 120b) of the first transistor 210 is connected to the first bit line BL1 for reading.

As such, the second transistor may be used as a write transistor, and the first transistor may be used as a read transistor.

In the process of writing data (logic 0 (ground) or 1 (Vdd)), when the second transistor TR2 is turned "ON" through the word line WL after data is placed on the second bit line BL2, the data is transferred from the bit line 220 to the gate of the second transistor 210. When the data is logic 1, data is stored as zero volts at the gate of the first transistor TR1, and when the data is logic 0, data is stored in (Vdd-Vth) volts (where Vdd is the supply voltage and Vth is the threshold voltage of the second transistor TR2). After the write operation, data is maintained at the gate of the first transistor TR1 due to the intrinsic capacitance (e.g., the second gate insulating layer 140) of the first transistor TR1.

In each memory cell MC, when logic 0 is stored in the gate of the first transistor TR1, the first transistor TR1 is turned "off", and when logic 1 is stored in the gate of the first transistor TR1, the first transistor TR1 is turned "on" to discharge the power line VL through the second bit line BL2 to read the logic 1 stored in the memory cell (in detail, the first transistor).

As such, as illustrated in FIGS. 1, 2A and 2B, the DRAM cells having two transistors may be connected by the word lines WL extending in the first direction D1, common read and write bit lines BL1 and BL2 respectively extending in the second direction D2, and the power line VL, thereby constituting the cell array.

As described in the previous embodiment, the first transistor TR1 is implemented as an n-channel MOSFET, and the second transistor TR2 is implemented as a tunneling FET having a Vertical Channel Transistor (VCT) structure. In detail, the second transistor TR2 used as the write transistor is implemented as a VCT structure extending in the third direction D3 on the gate electrode 140 of the first transistor TR1 such that the size of the memory cell may be scaled down.

Figure 4A:
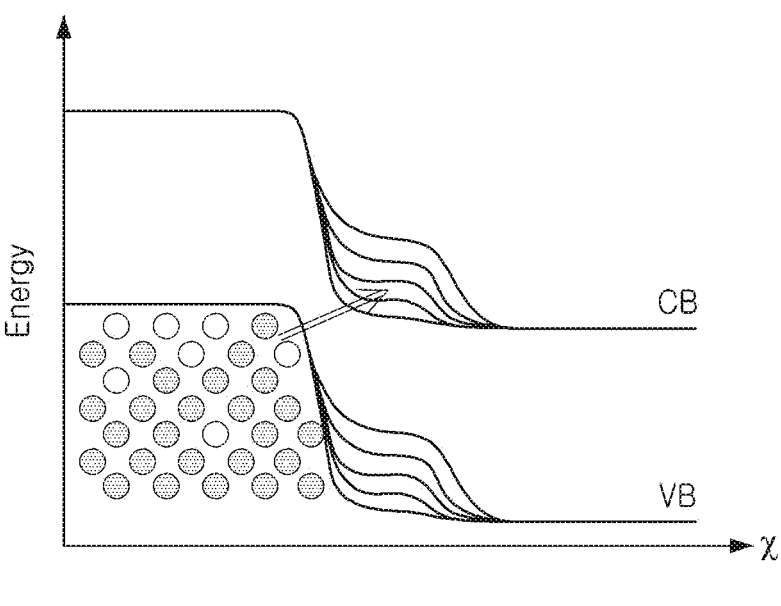
FIGS. 4A and 4B are band diagrams illustrating an operation principle of a tunneling transistor employed as a second transistor of the semiconductor memory device of FIG. 1, and are graphs illustrating an effect of employing the tunneling transistor.

In addition, the second transistor employed in this embodiment is implemented as a tunneling FET to limit and/or prevent leakage current. In detail, the tunneling FET has a second source region and a second drain region respectively formed of a high-concentration p-type impurity region and a high-concentration n-type impurity region, and a channel region as an intrinsic region, and as illustrated in FIG. 4A, electric charges are tunneled when the gate voltage is applied, thereby having a structure in which current conducts.

Figure 4B:
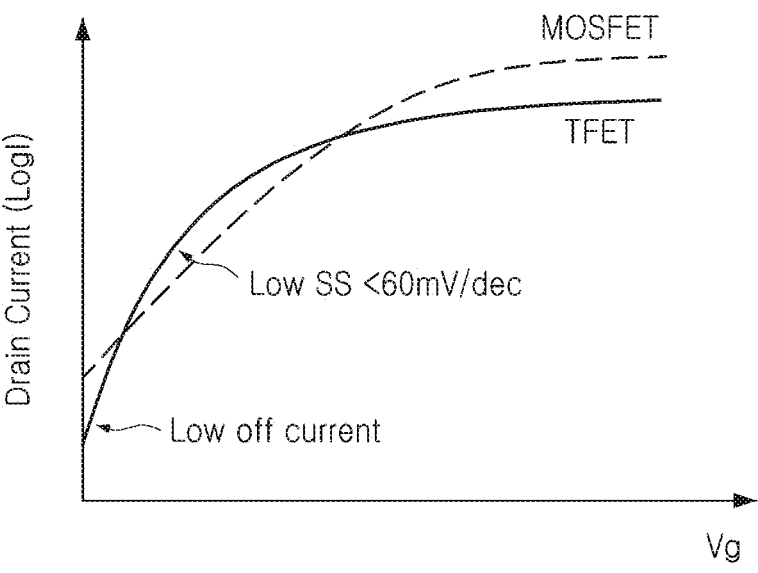

This tunneling FET has a characteristic of generating little leakage current compared to a typical MOSFET device when 0 volts is applied to the gate voltage. In detail, as illustrated in FIG. 4B, when the gate voltage is zero, the tunneling FET generates a larger drain current than a drain current of the MOSFET when a constant gate voltage (<60 mV) is applied, but may hardly generate a low leakage current when the gate voltage is zero. As such, by implementing the second transistor as a tunneling FET, a leakage current may be reduced in a state in which the gate voltage is turned off, and as a result, a retention time of the semiconductor memory device 100 may be increased.

Figure 5:
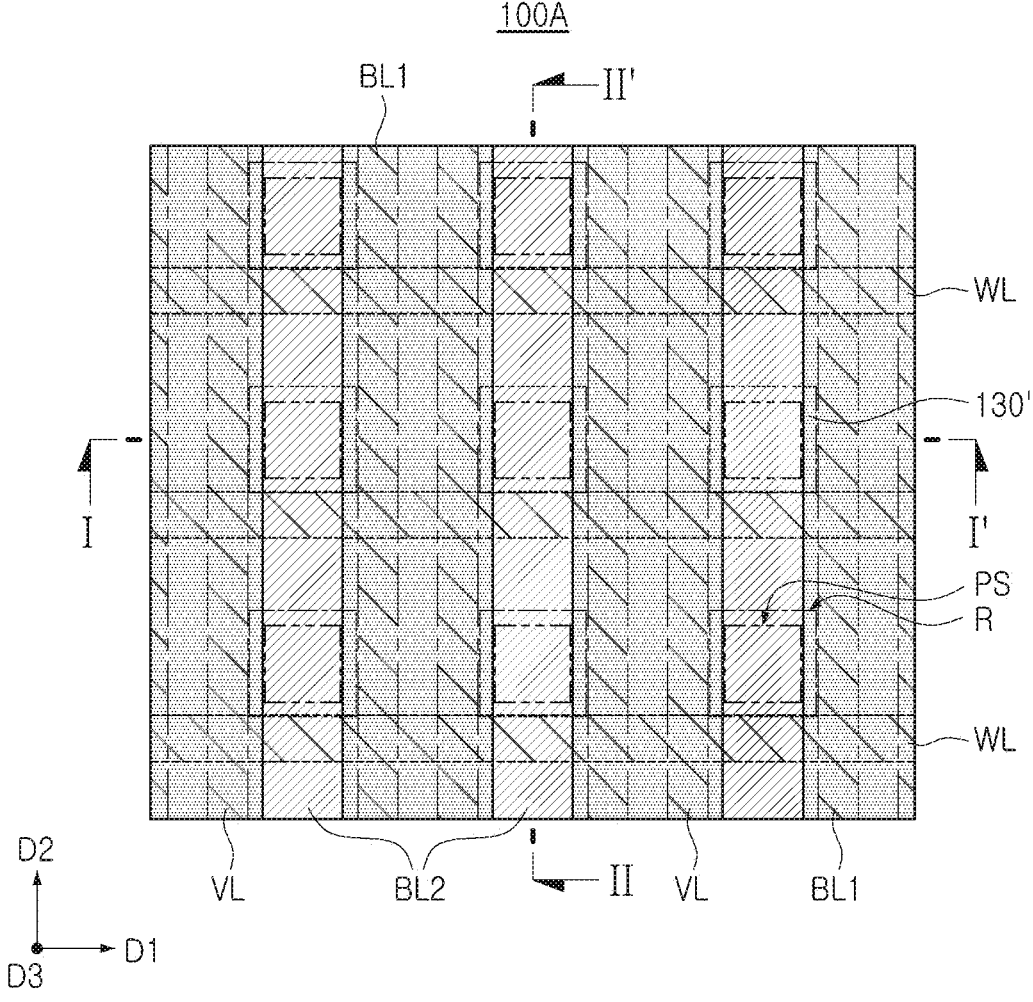
FIG. 5 is a plan view illustrating a semiconductor memory device according to an example embodiment.
Figure 6A:
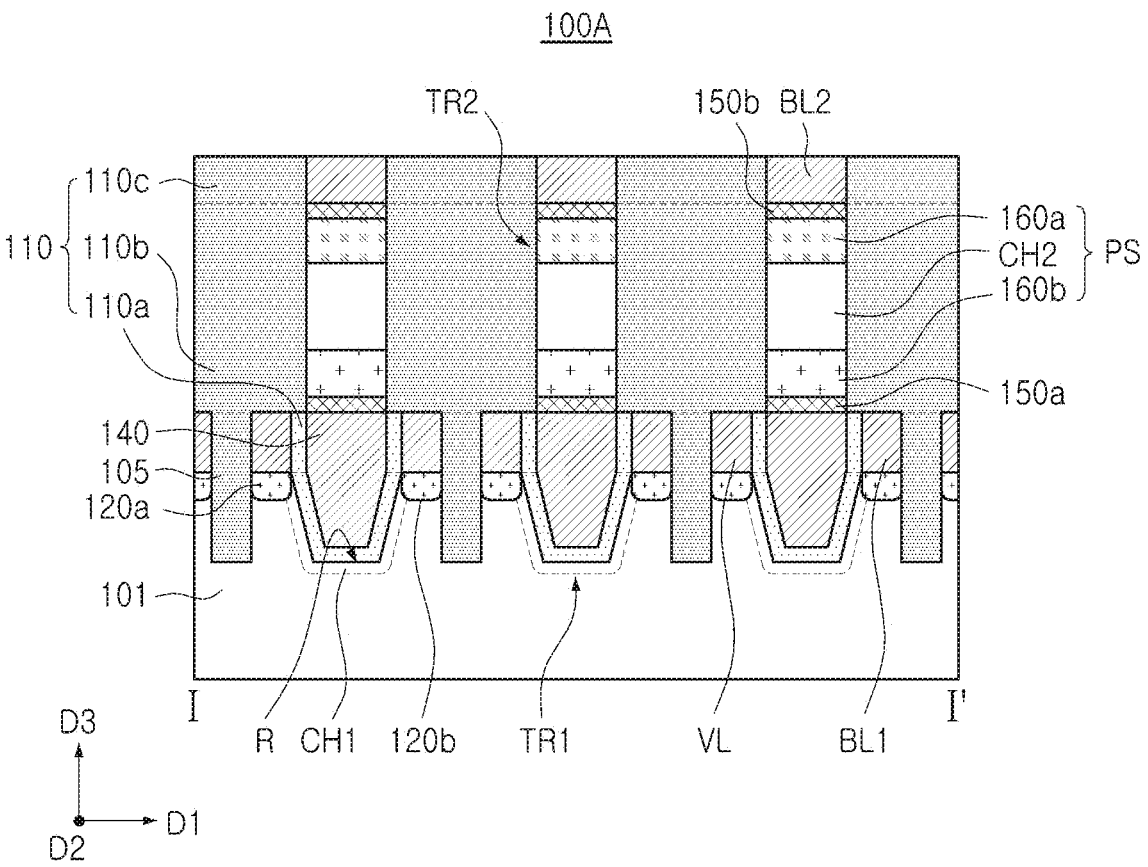
FIGS. 6A and 6B are cross-sectional views of the semiconductor memory device of FIG. 5 taken along lines I-I' and II-II', respectively.
Figure 6B:
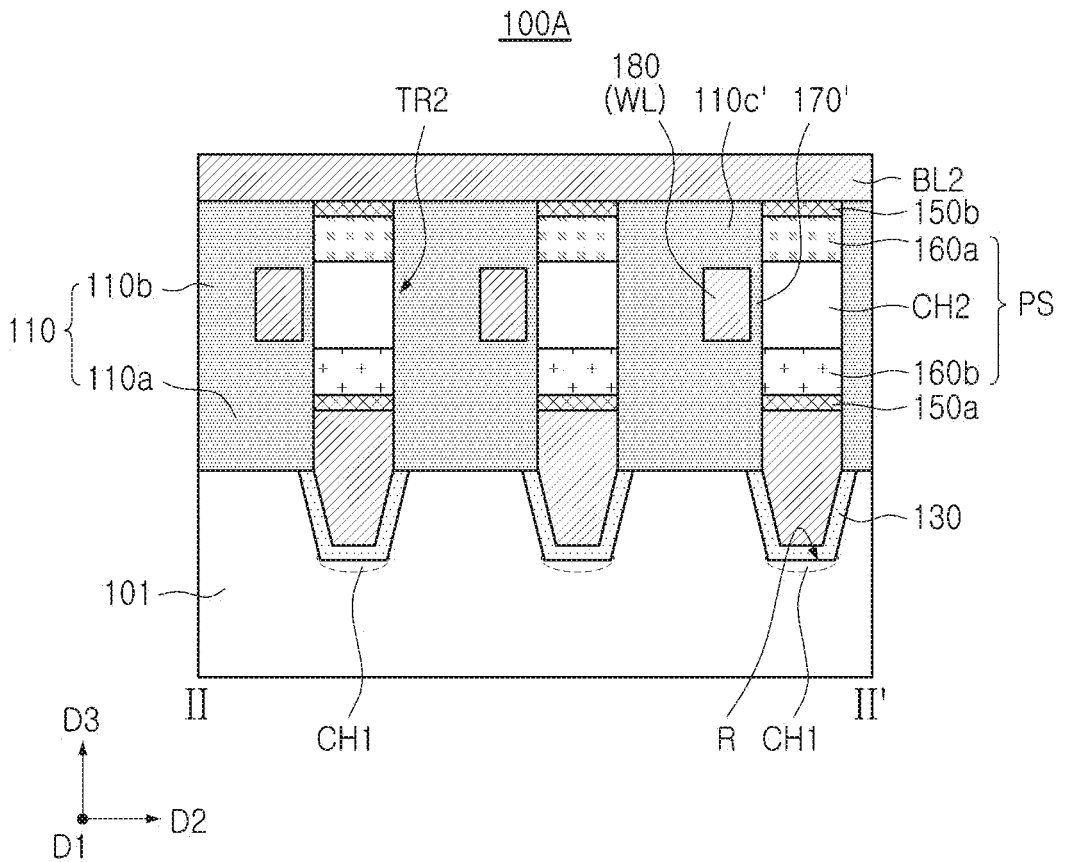

FIG. 5 is a plan view illustrating a semiconductor memory device according to an example embodiment, and FIGS. 6A and 6B are cross-sectional views of the semiconductor memory device of FIG. 5 taken along lines I-I' and II-II', respectively.

Referring to FIGS. 5, 6A, and 6B, a semiconductor memory device 100A according to an example embodiment may be understood to be similar to the semiconductor memory device 100 illustrated in FIGS. 1 and 2A and 2B, except that a first gate insulating layer 130 is formed of a material different from a material of the first interlayer insulating layer 110a and a second gate insulating layer 170' is formed of the same material as the material of the second interlayer insulating layer 110b. In addition, the components of the present embodiment may be understood with reference to descriptions of the same or similar components of the semiconductor memory device 100 illustrated in FIGS. 1 and 2A and 2B unless otherwise specified.

The semiconductor memory device 100A according to the present embodiment may include an array of memory cells having first and second transistors TR1 and TR2 stacked in a third direction D3, respectively, similarly to the previous embodiment. The first transistor TR1 acts as a capacitor in which data is written, and may include a MOSFET having a channel CH1 having a three-dimensional structure using the recess R. In addition, the second transistor TR2 has a VCT structure including the pillar structure PS extending in the third direction D3 on the first gate electrode 140, and includes a tunneling FET in which a second source region 160a and a second drain region 160b are a p-type impurity region and an n-type impurity region, respectively.

In this embodiment, the first gate insulating layer 130 may include a material different from a material of the first interlayer insulating layer 110a, unlike the previous embodiment. For example, the first interlayer insulating layer 110a may be silicon oxide, and the first gate insulating layer 130 may be at least one of silicon nitride, aluminum oxide, zirconium oxide, hafnium oxide, lanthanum oxide, and yttrium oxide. Also, unlike the previous embodiment, the second gate insulating layer 170' may include the same material as a material of the second interlayer insulating layer 110b. For example, the second interlayer insulating layer 110b and the second gate insulating layer 170' may be formed of silicon oxide.

Although the first and second gate insulating layers 130' and 170 are illustrated as being formed in different methos, in another embodiment, the first and second gate insulating layers 130' and 170 may be formed in the same method. For example, the first and second gate insulating layers 130' and 170 may be formed of the same material as the material of the first and second interlayer insulating layers 110a and 110b disposed therearound, respectively. In another example, the first and second gate insulating layers 130' and 170 may include the same material as the first and second interlayer insulating layers 110a and 110b, respectively, or may both include a high-k material.

Figure 7:
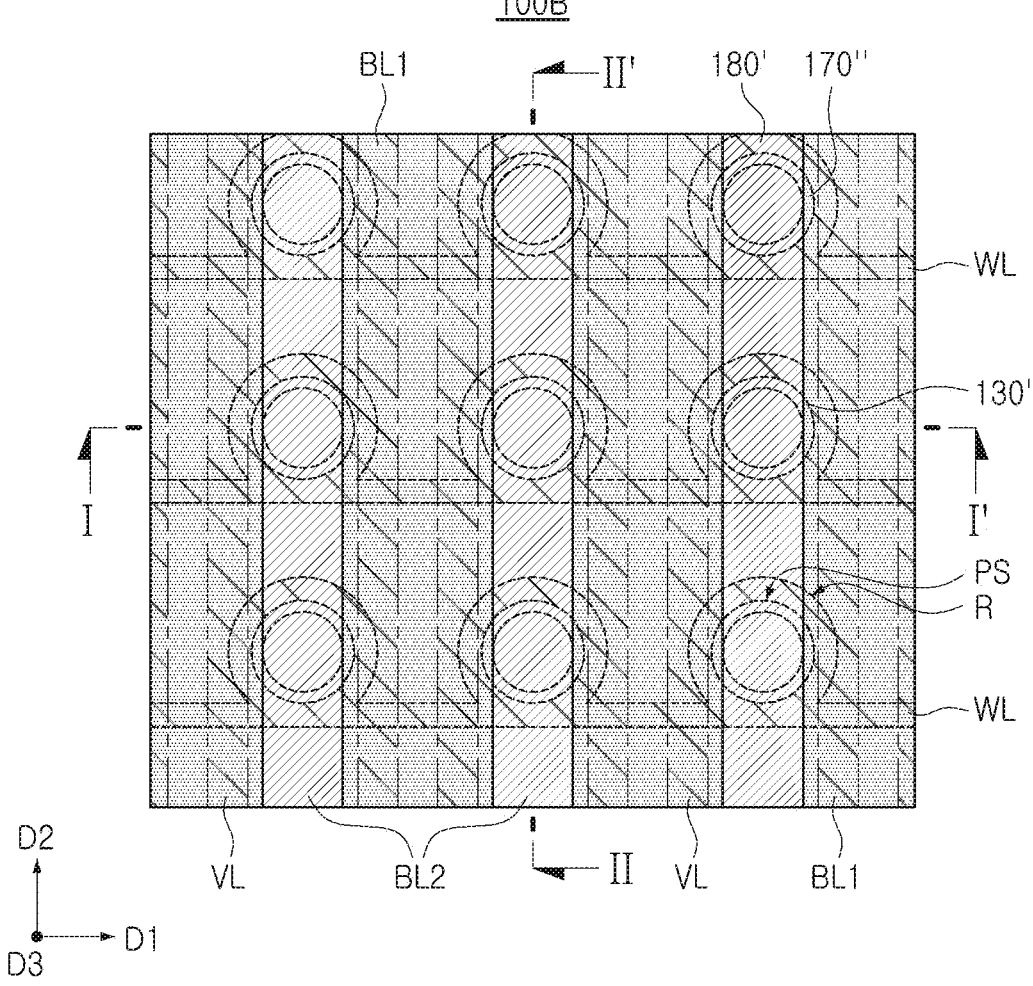
FIG. 7 is a plan view illustrating a semiconductor memory device according to an example embodiment.
Figure 8A:
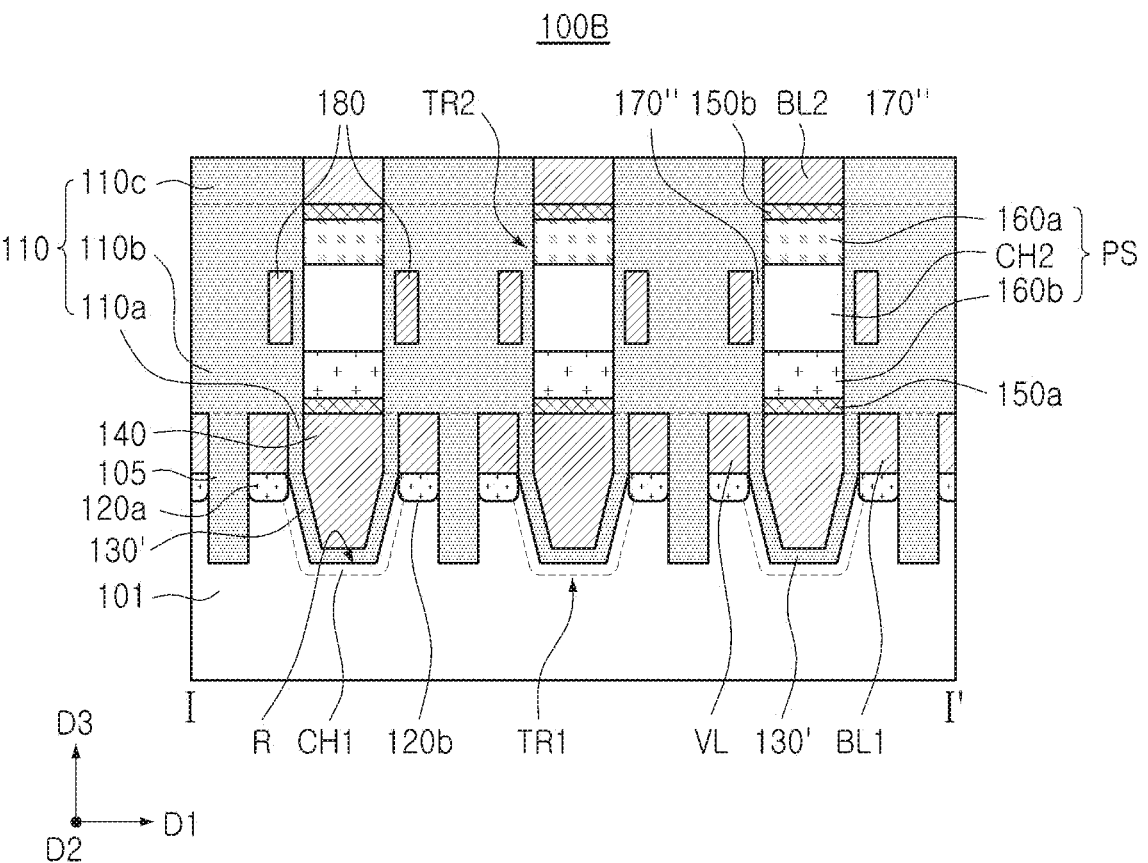
FIGS. 8A and 8B are cross-sectional views of the semiconductor memory device of FIG. 7 taken along lines I-I' and II-II', respectively.
Figure 8B:
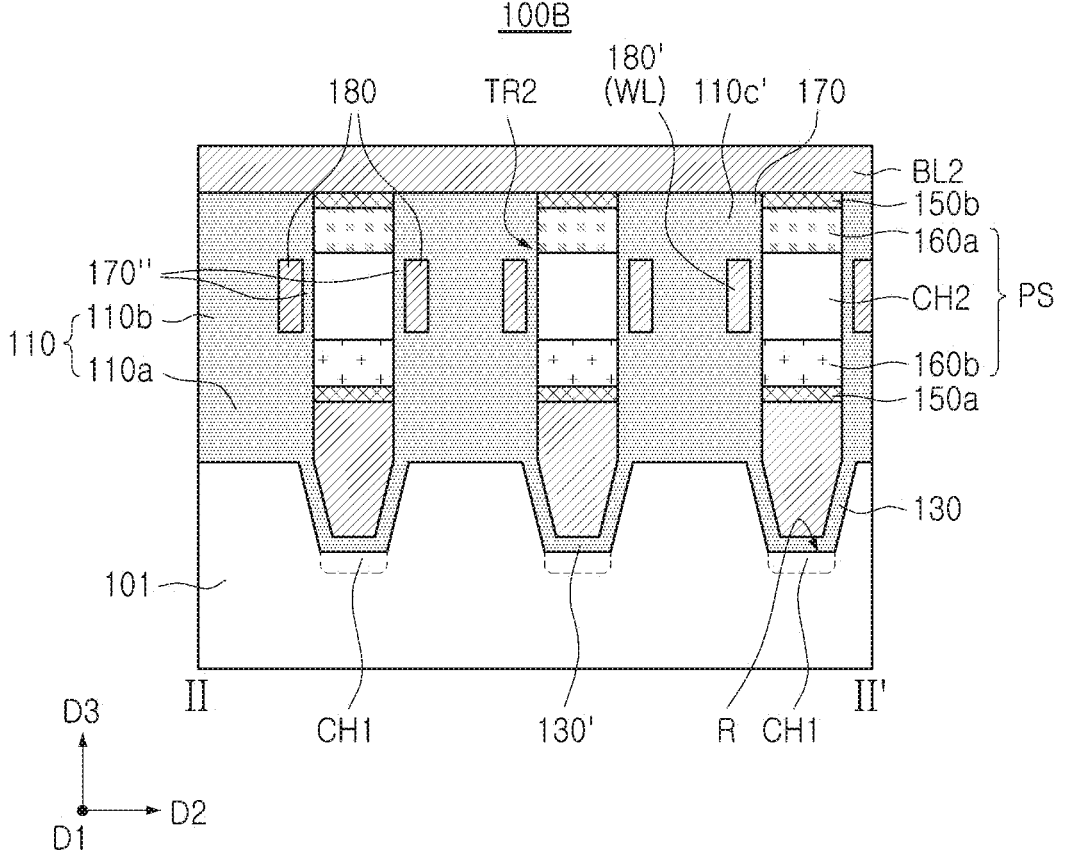

FIG. 7 is a plan view illustrating a semiconductor memory device according to an example embodiment, and FIGS. 8A and 8B are cross-sectional views of the semiconductor memory device of FIG. 7 taken along lines I-I' and II-II', respectively.

Referring to FIGS. 7, 8A, and 8B, except that the second gate electrode 180 surrounds the second channel region CH2 and the second gate insulating layer 170' is formed of the same material as a material of the second interlayer insulating layer 110b, a semiconductor memory device 100B according to an example embodiment may be understood as similar to the semiconductor memory device 100 illustrated in FIGS. 1, 2A and 2B. In addition, the components of the present embodiment may be understood with reference to descriptions of the same or similar components of the semiconductor memory device 100 illustrated in FIGS. 1 and 2A and 2B unless otherwise specified.

Unlike the previous embodiment, the semiconductor memory device 100B according to the present example embodiment has the second gate electrode 180 surrounding the second channel region CH2 of the pillar structure. In the present embodiment, the second channel region CH2 is formed along the side surface surrounding the pillar structure PS, thereby having a relatively larger channel area. On the other hand, the pillar structure PS employed in this embodiment may have a cylindrical shape, unlike the previous embodiment. The shape of the pillar structure PS is not limited thereto, and may be a pillar structure having various shapes of flat cross-sections.

The second gate insulating layer 170' may also include the same material as a material of the second interlayer insulating layer 110b. For example, the second interlayer insulating layer 110b and the second gate insulating layer 170' may be formed of silicon oxide. The second gate insulating layer 170' may include a material similar to a material of the first gate insulating layer 130'.

Figure 9:
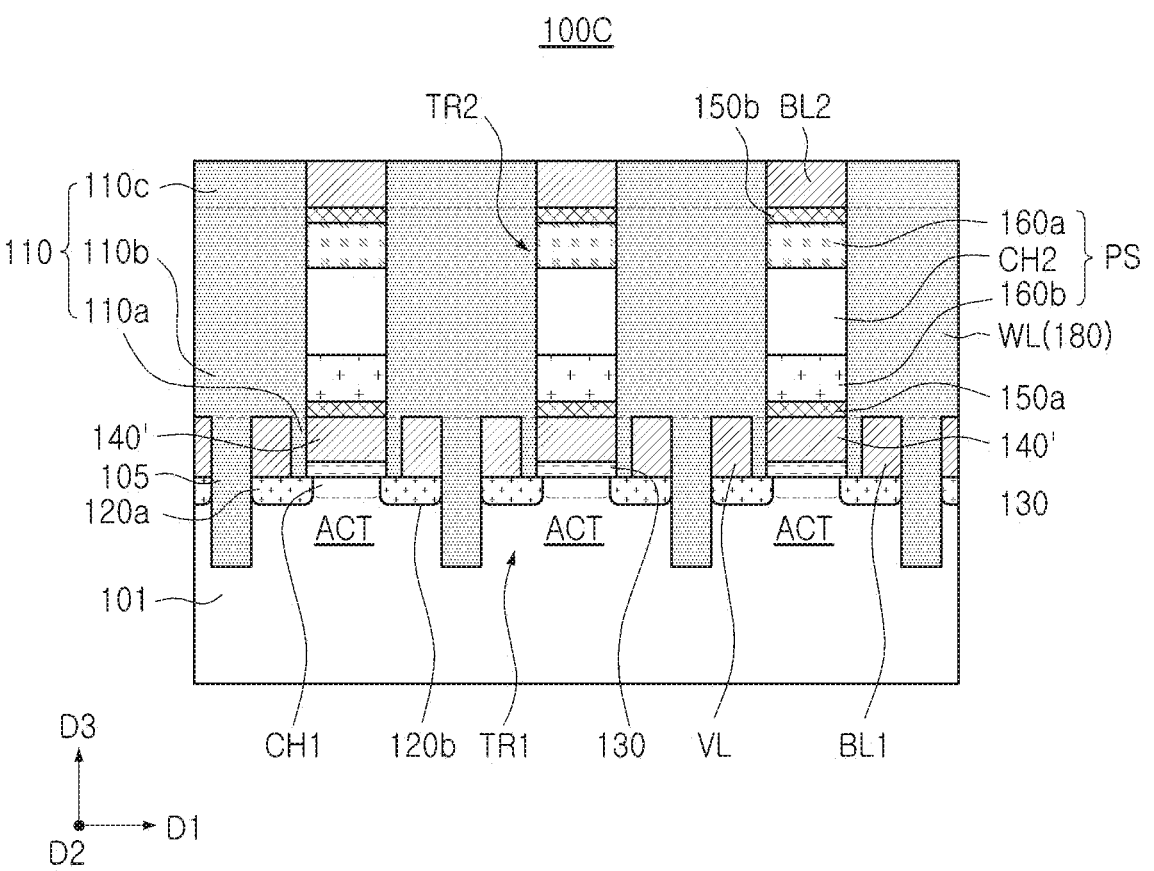
FIG. 9 is a cross-sectional view illustrating a semiconductor memory device according to an example embodiment.

FIG. 9 is a cross-sectional view illustrating a semiconductor memory device according to an example embodiment, and may be understood as a cross-sectional view corresponding to FIG. 2A.

Referring to FIG. 9, a semiconductor memory device 100C according to an example embodiment may be understood as similar to the semiconductor memory device 100 illustrated in FIGS. 1, 2A and 2B except that the first transistor TR1 has a planar structure rather than a 3D channel structure. In addition, the components of the present embodiment may be understood with reference to descriptions of the same or similar components of the semiconductor memory device 100 illustrated in FIGS. 1, 2A and 2B unless otherwise specified.

In the previous embodiments, the first transistor TR1 has a three-dimensional channel structure using a structure such as a recess, and thus, a relatively large capacity may be ensured in a limited area, but inventive concepts are not limited thereto. For example, the first transistor TR1 may be of a planar type as in the present embodiment. In detail, the active region ACT defined by the device isolation layer 105 has a flat upper surface, and a gate structure having a gate insulating layer 130 and a gate electrode 140' is formed on the upper surface of the active region ACT, and by forming source/drain regions on both sides thereof, the first transistor TR1 having a required planar type may be provided.

Figure 10A:
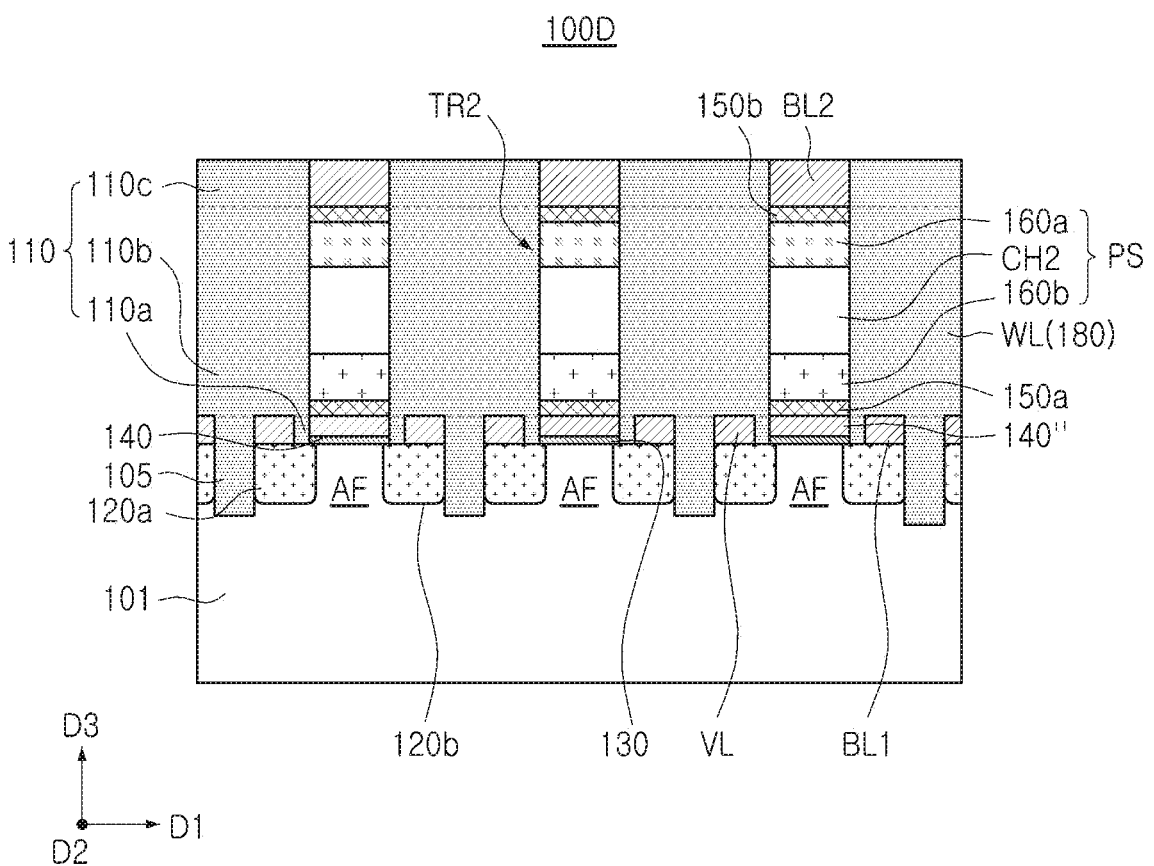
FIGS. 10A and 10B are cross-sectional views illustrating a semiconductor memory device according to an example embodiment.
Figure 10B:
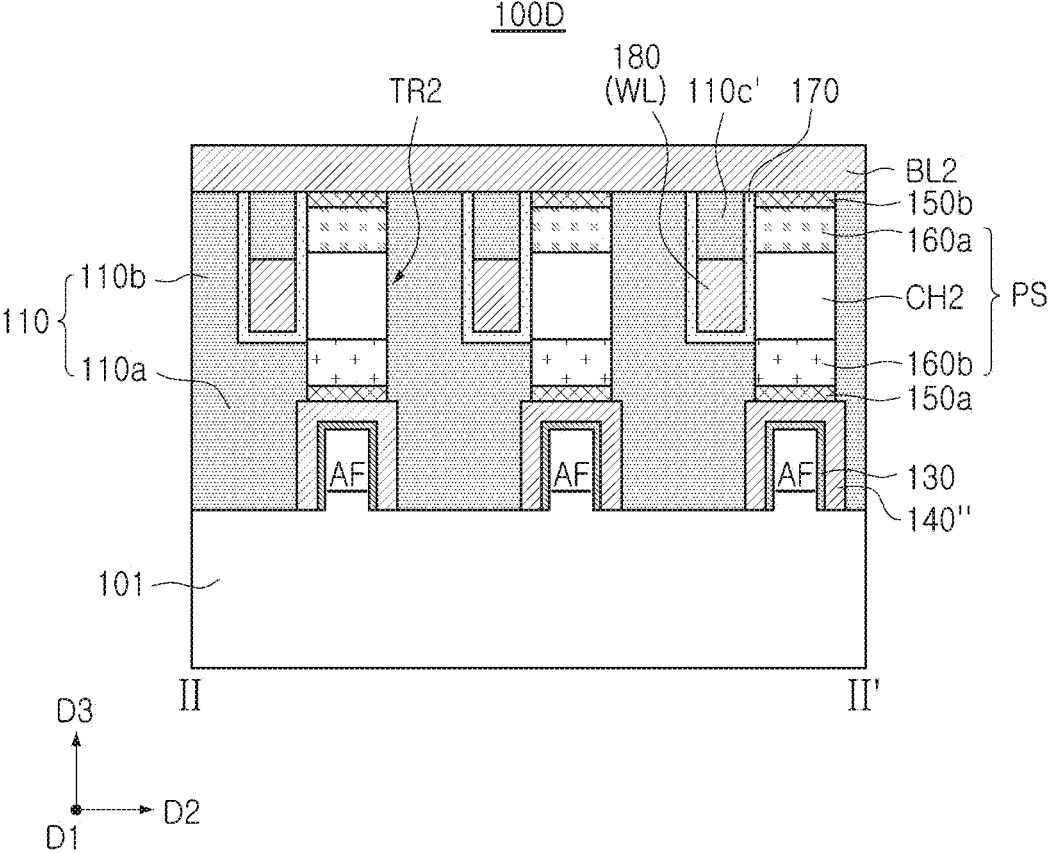

FIGS. 10A and 10B are cross-sectional views illustrating a semiconductor memory device according to an example embodiment, and may be understood as cross-sectional views corresponding to FIGS. 2A and 2B, respectively.

Referring to FIGS. 10A and 10B, a semiconductor memory device 100D according to an example embodiment may be understood as similar to the semiconductor memory device 100 illustrated in FIGS. 1, 2A and 2B, except that the first transistor TR1 has a different type of three-dimensional channel structure. In addition, the components of the present embodiment may be understood with reference to descriptions of the same or similar components of the semiconductor memory device 100 illustrated in FIGS. 1 and 2A and 2B unless otherwise specified.

Unlike the previous embodiment, the first transistor TR1 employed in this embodiment has a three-dimensional channel structure using an active fin AF. As illustrated in FIGS. 10A and 10B, the active fin AF protrudes from the upper surface of the substrate 101 and extends in the first direction D1. A gate electrode 140" may be formed to surround the upper and side surfaces of the active fin AF in the second direction D2 to form a three-dimensional channel structure. A gate insulating layer 130 may be disposed between the gate electrode 140" and the active fin AF.

The active fin AF may be a portion of the substrate 101. A first source region 120a and a first drain region 120b may be formed in the active fin AF region on both sides of the gate electrode 140" in the first direction D1. In detail, the first source region 120a and the first drain region 120b may be formed by recessing regions on both sides of the active fin AF and performing selective epitaxial growth (SEG) in the recessed region. As described above, the first source region 120a and the first drain region 120b may be respectively an n-type impurity region.

The memory cell according to the above-described embodiment includes two transistors stacked in a vertical direction, and by implementing the second transistor TR2 located at the upper side on the gate electrode of the first transistor TR1 located at the lower side, as a tunneling-FET having a VCT structure, the cell size may be scaled down while reducing the leakage current when the gate voltage is off, and the retention time of the semiconductor memory device may be increased.

FIGS. 11A to 20A are plan views for respective main processes illustrating a method of manufacturing a semiconductor memory device according to an example embodiment, and FIGS. 11B to 20B and 11B to 20C are cross-sectional views of the semiconductor memory device of FIGS. 11A to 20A, taken along lines I-I' and II-II', respectively.

Figure 11A:
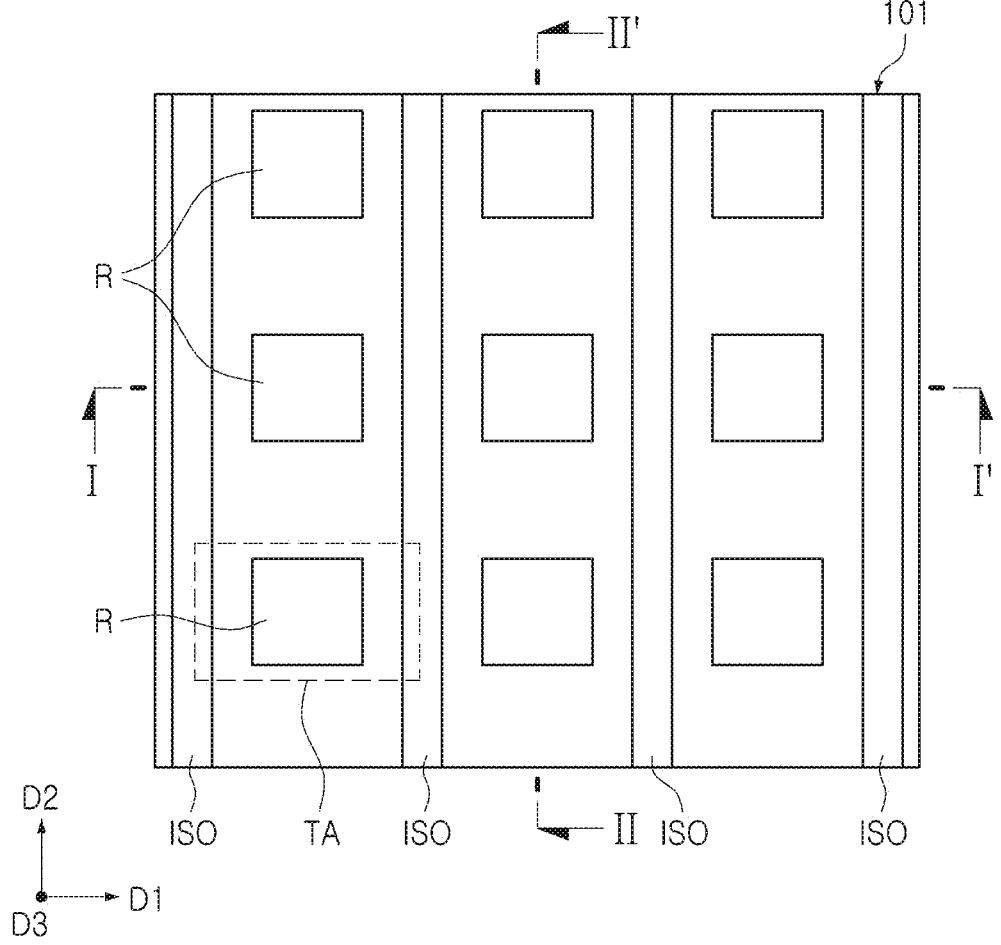
Figure 11B:
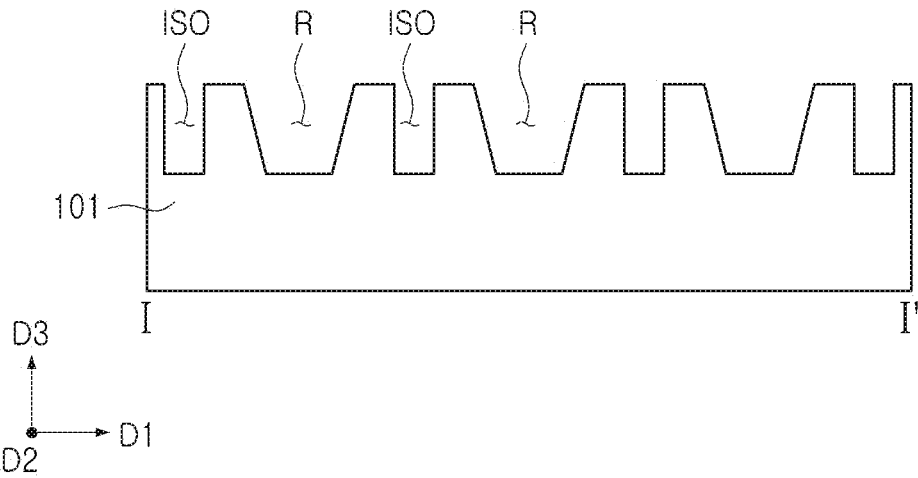
Figure 11C:
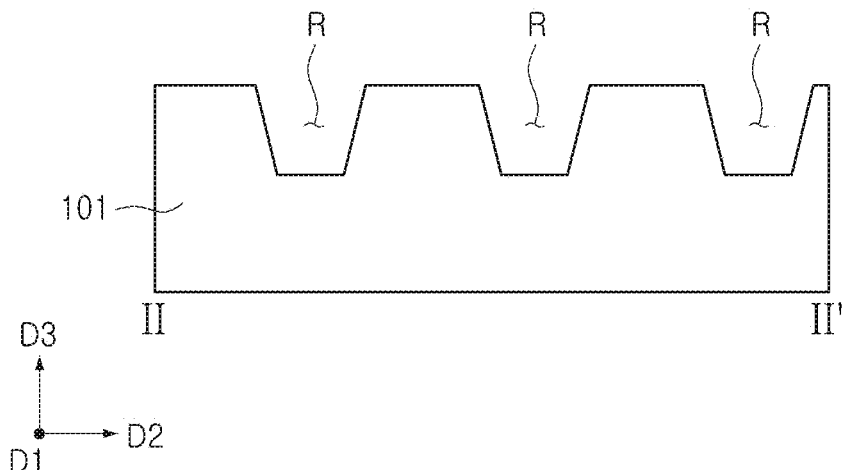

Referring to FIGS. 11A to 11C, a recess R is formed in an area TA corresponding to a memory cell (in detail, a first transistor) in a substrate 101, and a trench ISO may be formed to separate the recess R together with the process of forming the recess R.

The substrate 101 may include a group IV semiconductor, a group III-V compound semiconductor, or a group II-VI compound semiconductor. For example, the group IV semiconductor may include silicon, germanium, or silicon-germanium. For example, the substrate 101 may be a p-type silicon substrate.

The recess R forming process and the trench ISO forming process may be performed by an etching process using a single mask pattern. The trench ISO may have a depth substantially equal to the depth of the recess R. By ensuring the width of the trench ISO to be relatively narrower, the depth of the trench may be slightly greater than the depth of the recess R.

On the substrate 101, the recesses R constituting respective cells may be repeatedly arranged in the first and second directions D1 and D2 that are parallel to the upper surface of the substrate 101 and intersect each other. The trench ISO extending in the second direction D2 may be formed such that the recesses R are separated in units of columns in the second direction D2.

Figure 12A:
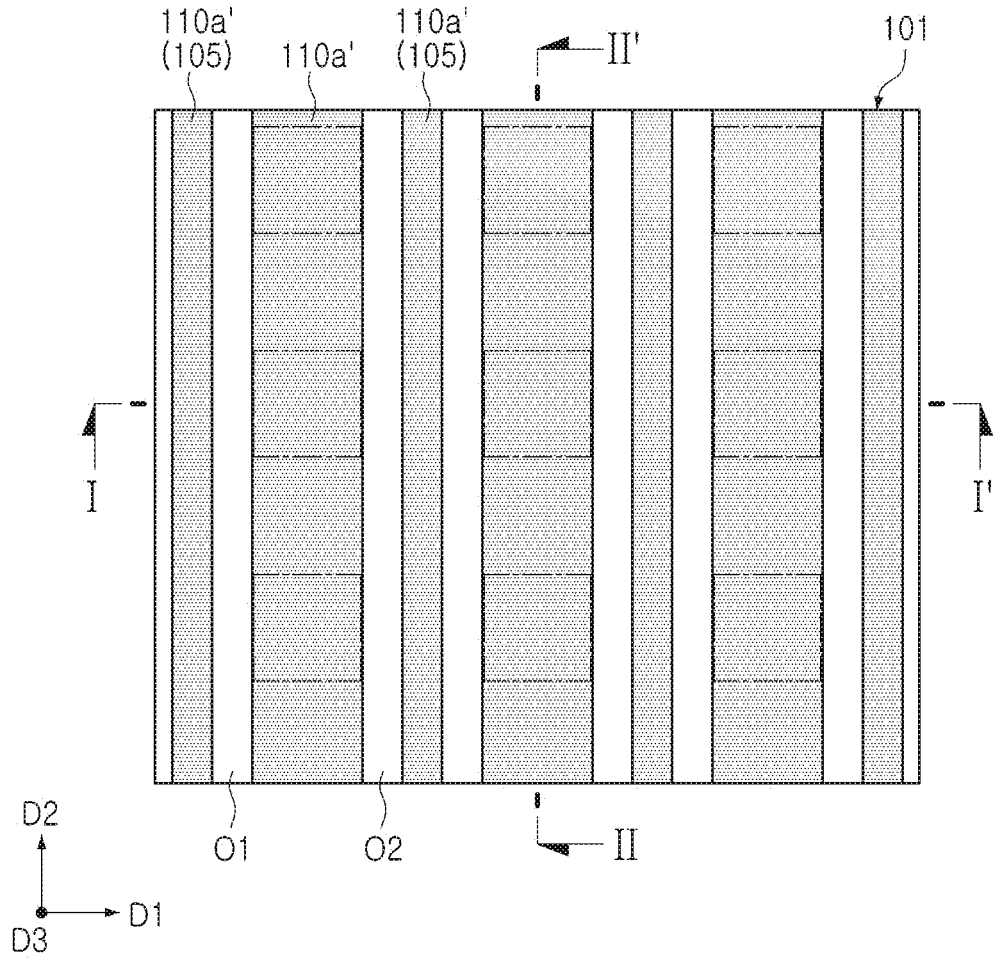
Figure 12B:
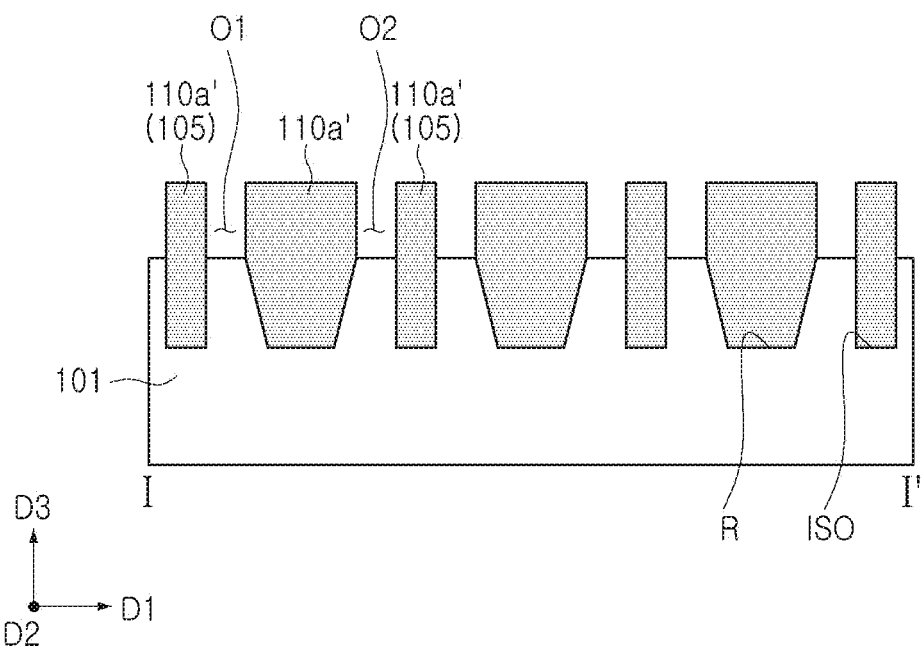
Figure 12C:
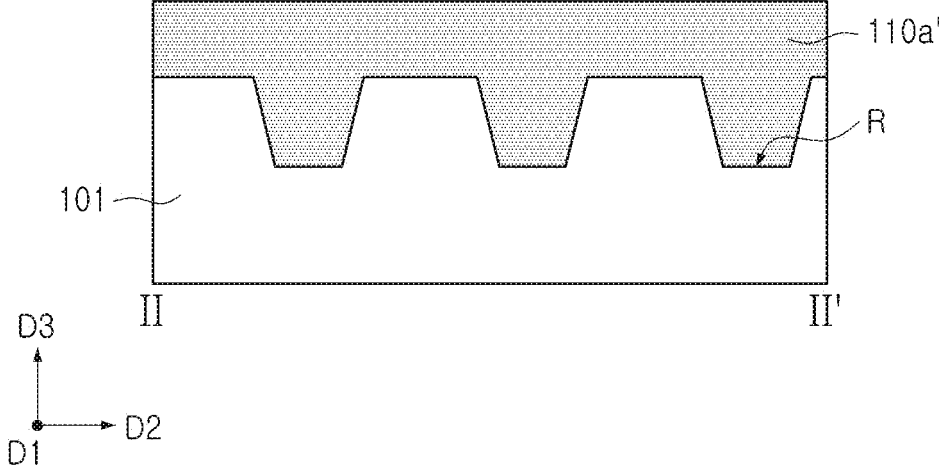

Referring to FIGS. 12A to 12C, an insulating material layer 110a' is formed on the substrate 101, and a first opening O1 and a second opening O2 are formed in both sides of the recess R, respectively.

An insulating material layer 110a is formed on the substrate 101 to fill the recess R and the trench ISO. The insulating material layer may include the device isolation layer 105 filled in the trench ISO. For example, the insulating material layer 110a' may include silicon oxide, silicon oxynitride, silicon nitride, or combinations thereof.

After the insulating material layer 110a' is formed, the first opening O1 and the second opening O2 are formed in the insulating material layer 110'. The first and second openings O1 and O2 are respectively located in both regions of the recess R in the first direction D1, and may define a substrate region for the first source region and the first drain region, respectively. In the present example embodiment, the first opening O1 and the second opening O2 may be formed to extend in the second direction D2, respectively.

Figure 13A:
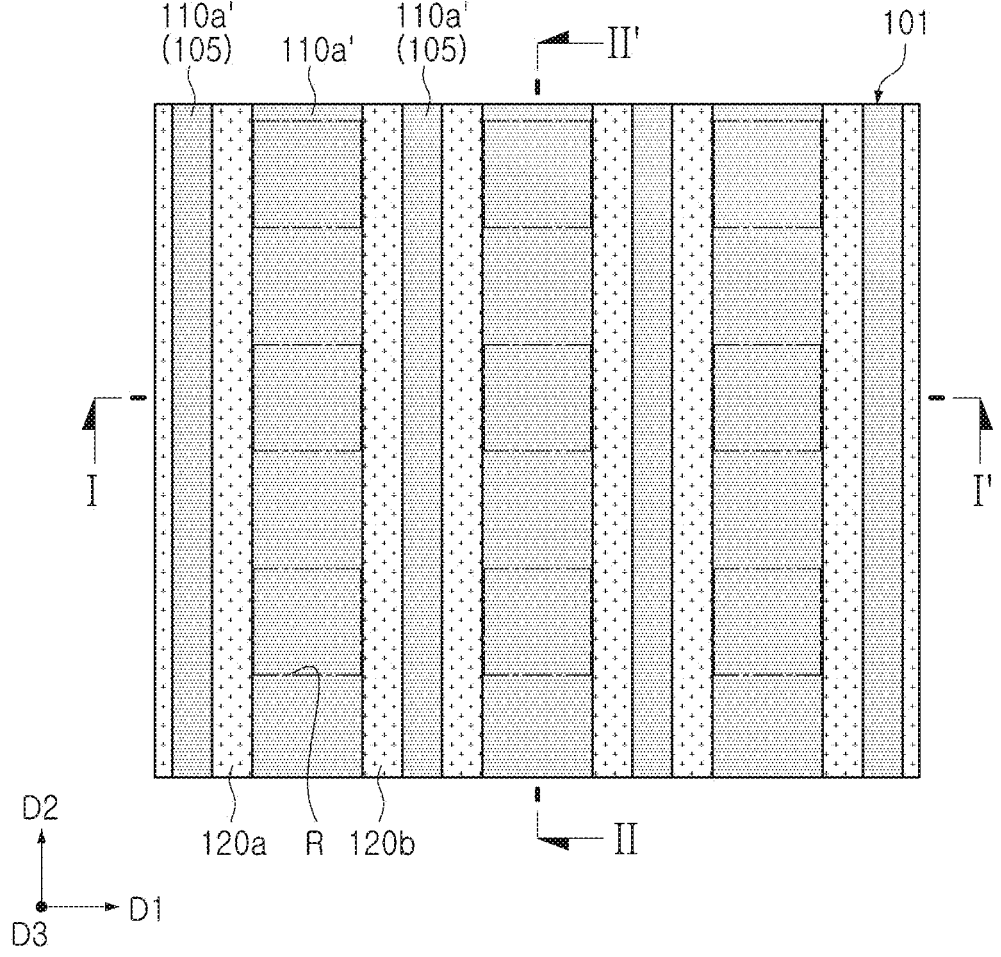
Figure 13B:
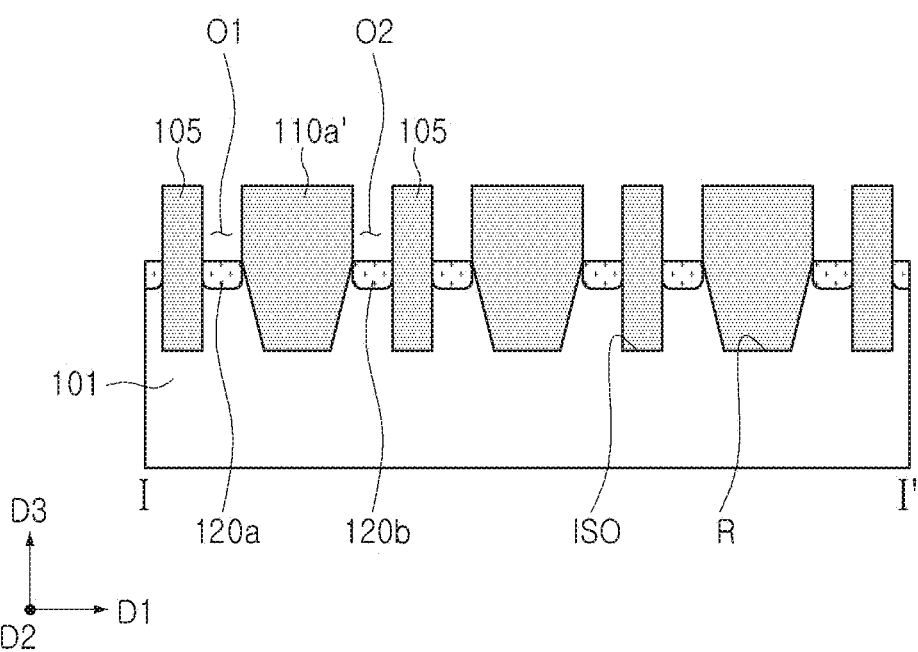
Figure 13C:
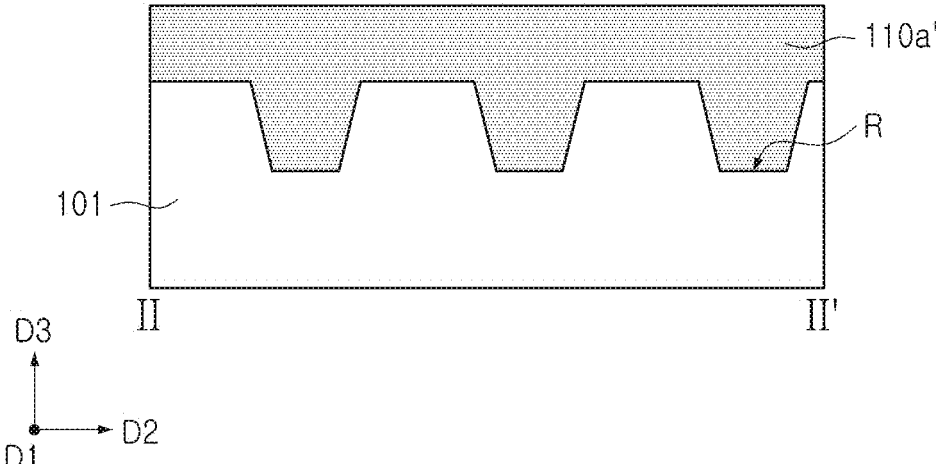

Referring to FIGS. 13A to 13C, a first source region 120a and a first drain region 120b may be formed in regions exposed through the first opening O1 and the second opening O2 in the substrate 101, respectively.

The first source region 120a and the first drain region 120b are formed by doping the regions exposed by the first opening O1 and the second opening O2 with the first conductivity-type impurity. The first source region 120a and the first drain region 120b may be respectively formed as a high-concentration n-type impurity region by doping the n-type impurity. In the present embodiment, the first source region 120a and the first drain region 120b may extend in the second direction D2 and be shared by the recesses R (memory cells) located in the same column, but inventive concepts is not limited thereto. For example, the first source region 120a and the first drain region 120b may be individually formed only on both sides of respective recesses R.

Figure 14A:
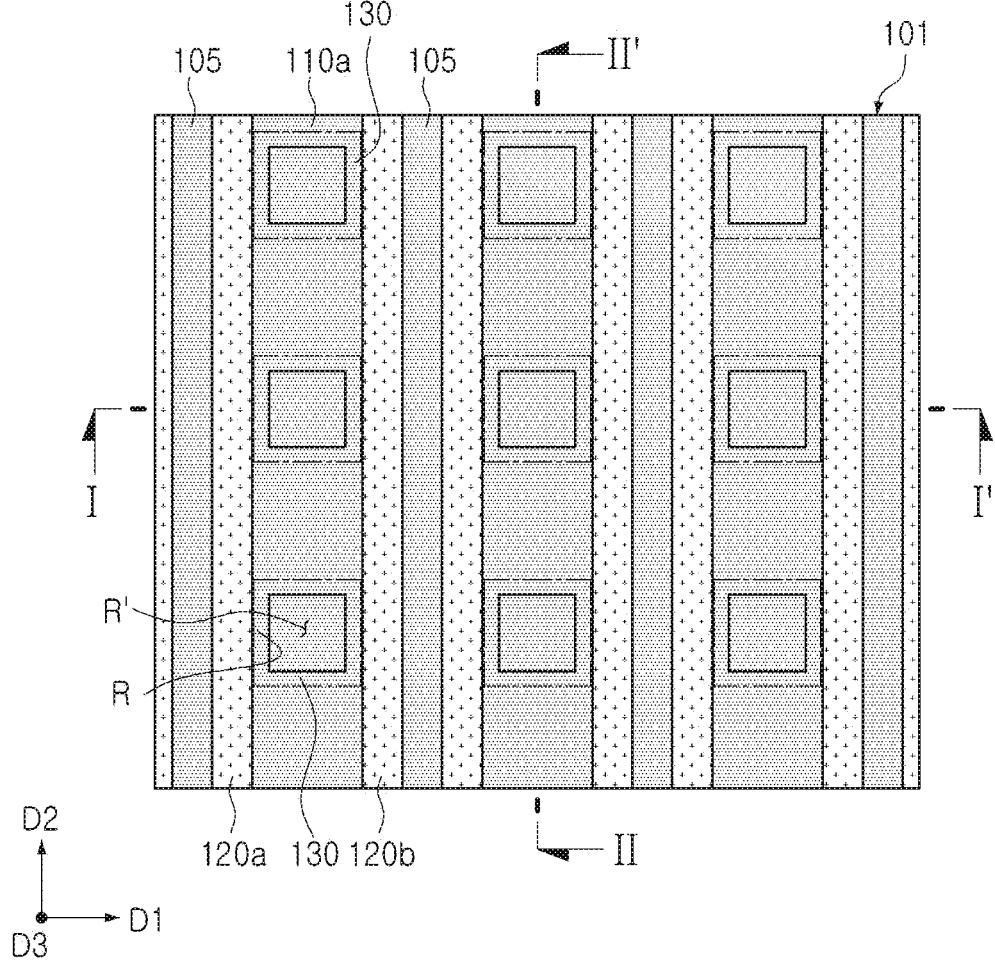
Figure 14B:
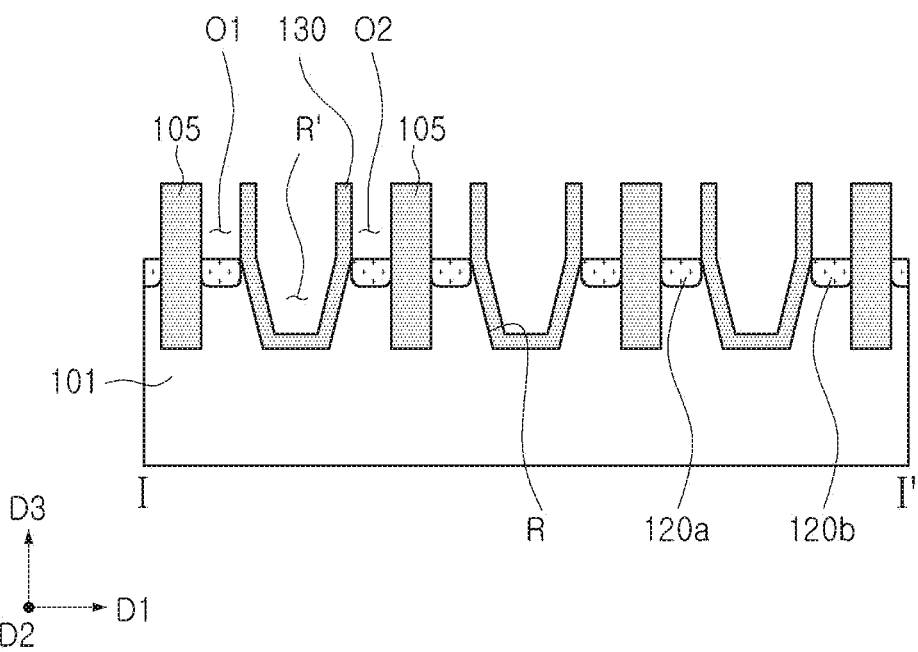
Figure 14C:
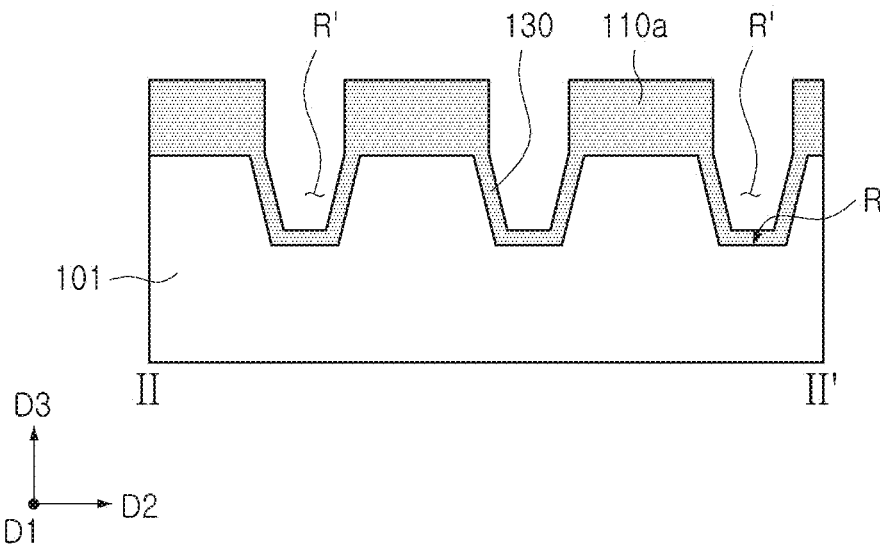

Referring to FIGS. 14A to 14C, the first gate insulating layer 130 is formed on the inner surface of the recess R.

The first gate insulating layer 130 may be formed by etching a portion of the insulating material layer 110a' located in the recess R. In this case, the first gate insulating layer 130 may be formed of the same material as a material of the insulating material layer 110a'. For example, both the first gate insulating layer 130 and the insulating material layer 110a' may be formed of silicon oxide.

Alternatively, after the insulating material layer 110a' is selectively etched using a mask pattern (e.g., a photomask) to expose the surface of the recess R, a required first gate insulating layer 130 may be conformally deposited on the surface of the recess R. In this case, the first gate insulating layer 130 may be formed of the same material as a material of the insulating material layer 110a'. In some embodiments, the first gate insulating layer 130 may be formed of a material different from a material of the insulating material layer 110a'. For example, the insulating material layer 110a' may be silicon oxide, and the first gate insulating layer 130 may be at least one of silicon nitride, aluminum oxide, zirconium oxide (ZrO), hafnium oxide (HfO), lanthanum oxide (LaO), and yttrium oxide (YO).

Figure 15A:
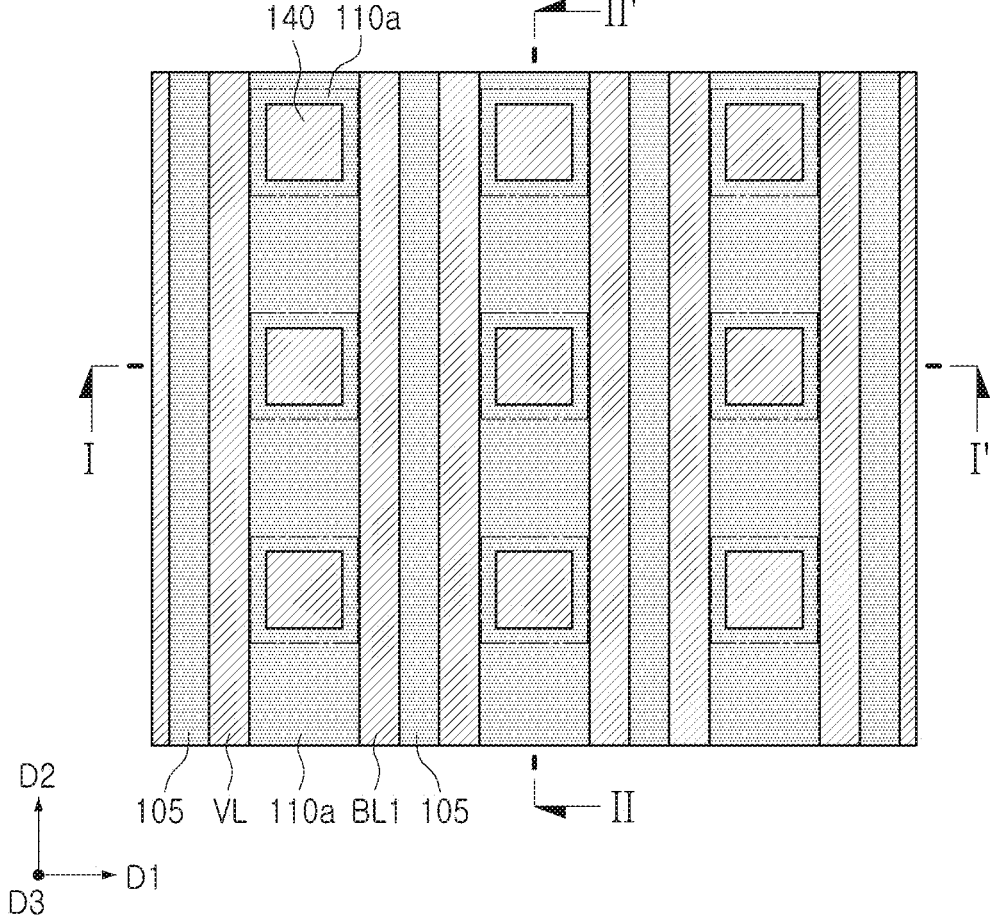
Figure 15B:
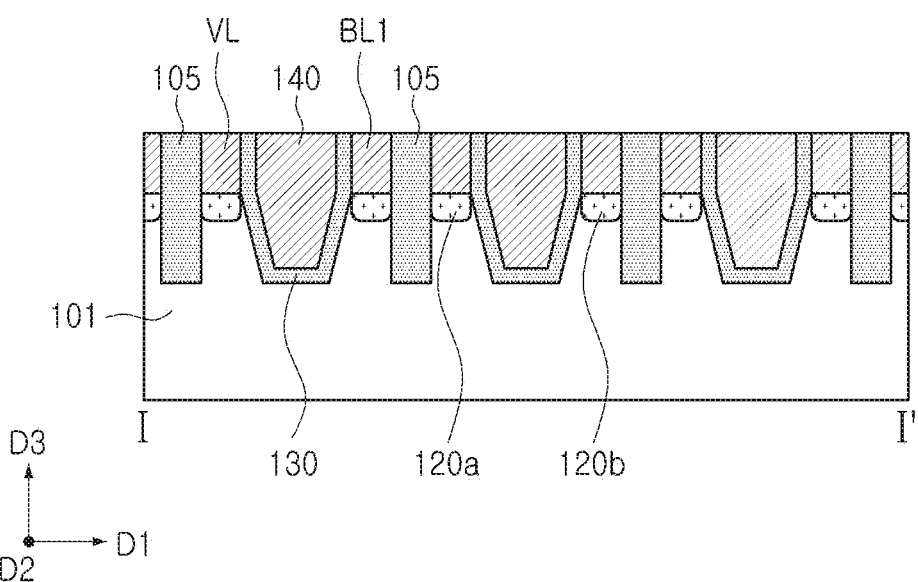
Figure 15C:
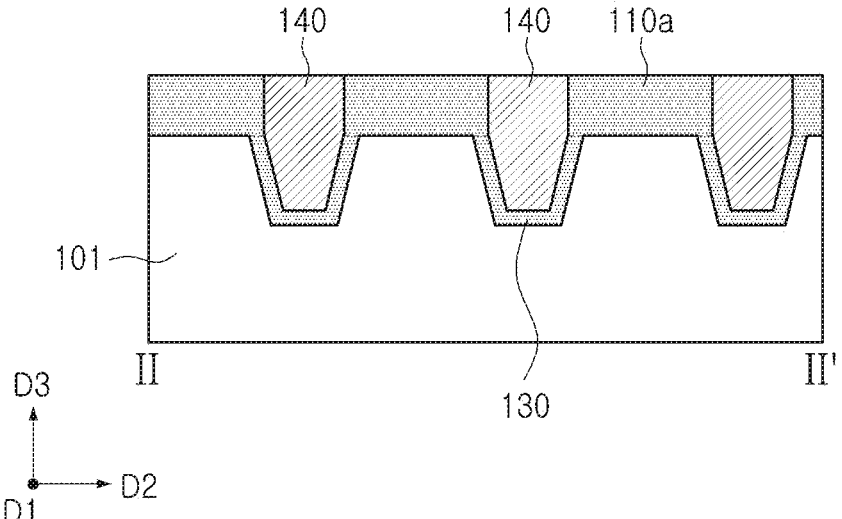

Referring to FIGS. 15A to 15C, after the first gate insulating layer 130 is formed, the first gate electrode 140 may be formed in a remaining space R' of the recess, and conductive lines BL1 and VL may be formed in the first and second openings O1 and O2, respectively.

A conductive plug is formed on the first interlayer insulating layer 110a to fill the remaining space R' of the recess and the first and second openings O1 and O2 respectively, and then, the conductive plug may be polished such that the upper surface of the conductive plug and the upper surface of the first interlayer insulating layer 110a are planarized using a planarization process such as a chemical-mechanical planarization (CMP). As a result, the first gate electrode 140 may be provided in the remaining space R', and conductive lines BL1 and VL may be formed in the first and second openings O1 and O2, respectively. The conductive lines BL1 and VL extend in the second direction D2 in parallel to each other, respectively, and may be provided as the first bit line BL1 and the power line VL, respectively.

The conductive plug may include, for example, a metal nitride such as a titanium nitride film (TiN), a tantalum nitride film (TaN), or a tungsten nitride film (WN), and/or a metallic material such as aluminum (Al), tungsten (W) or molybdenum (Mo), or a semiconductor material such as doped polysilicon. For example, the conductive plug may be formed of tungsten (W).

Figure 16A:
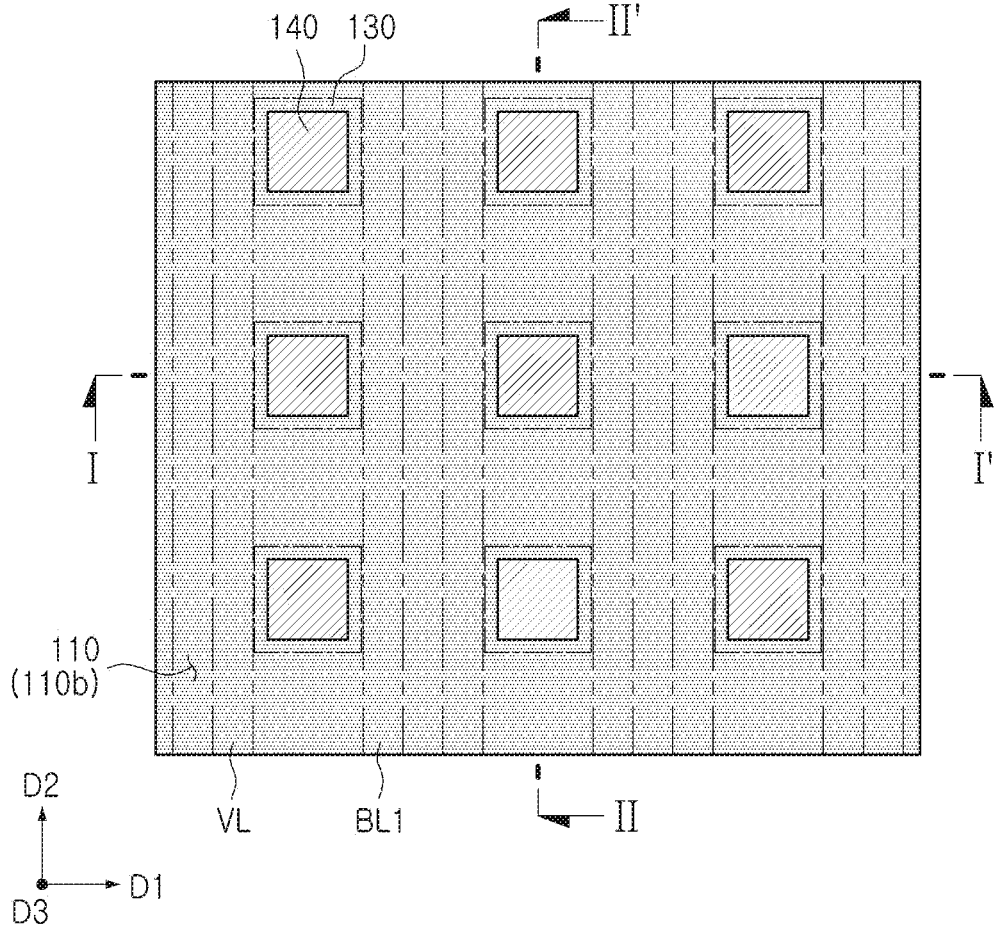
Figure 16B:
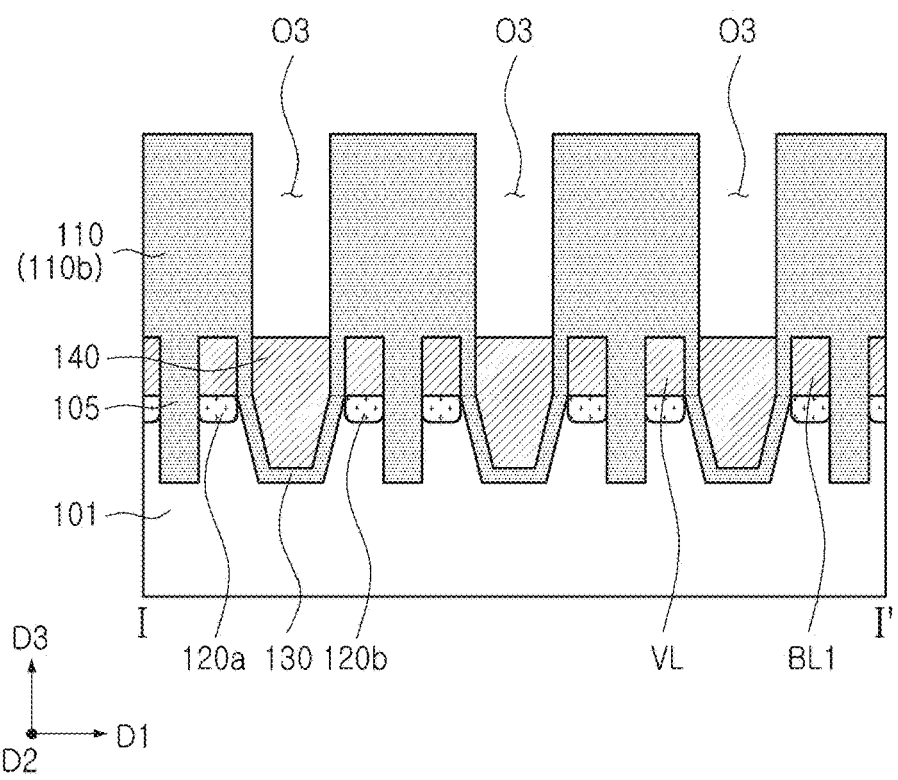
Figure 16C:
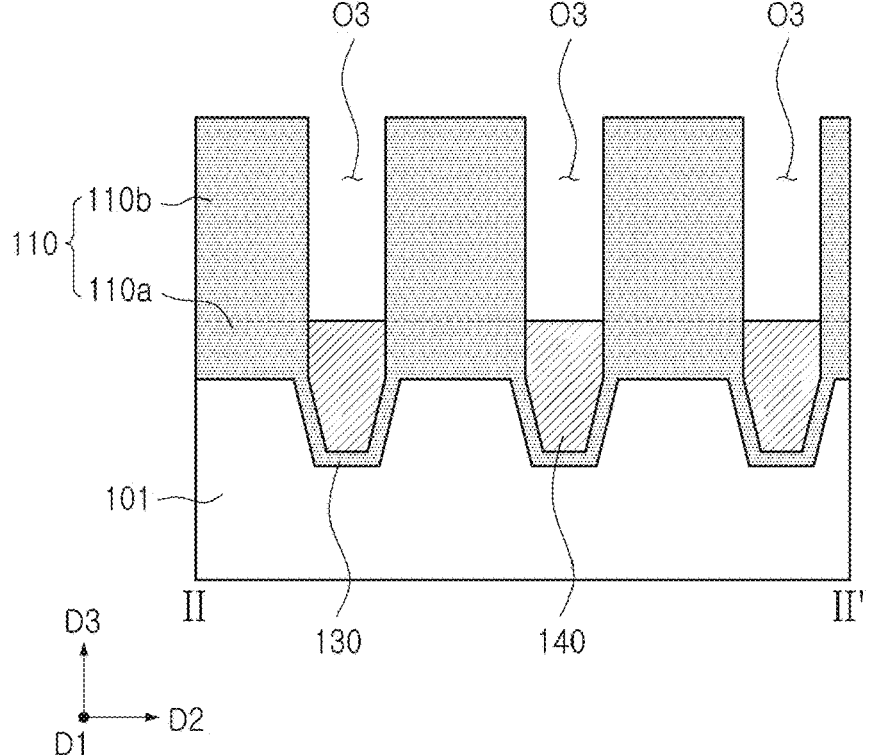

Referring to FIGS. 16A to 16C, a second interlayer insulating layer 110b is formed on the first interlayer insulating layer 110a, and a third opening O3 is formed in the second interlayer insulating layer 110b to expose the upper surface of the first gate electrode 140.

After the second interlayer insulating layer 110b is formed, the third opening O3 form formation of the pillar structure PS for the second transistor is formed. In the present example embodiment, the third opening may define the pillar structure PS to be formed in a subsequent process. The third opening O3 may be formed to be repeatedly arranged in the first and second directions D1 and D2 such that at least a portion of the first gate electrode 140 in each cell is exposed.

Figure 17A:
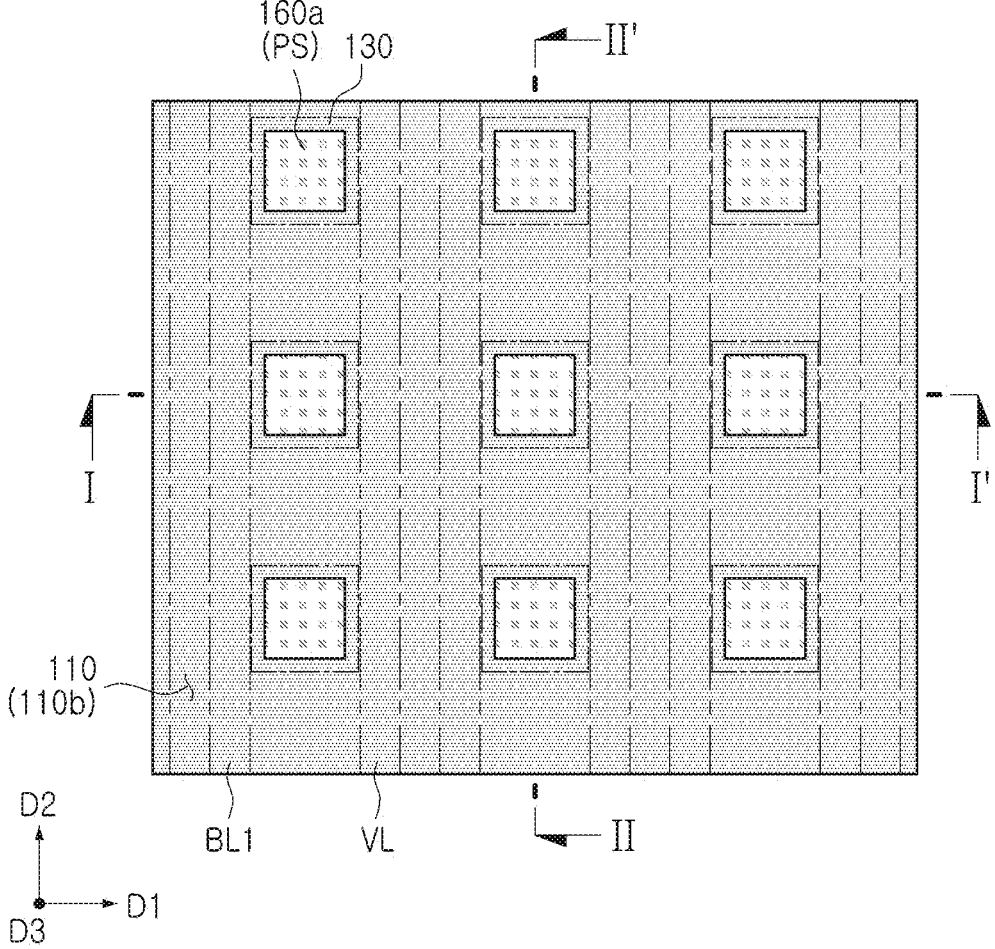
Figure 17B:
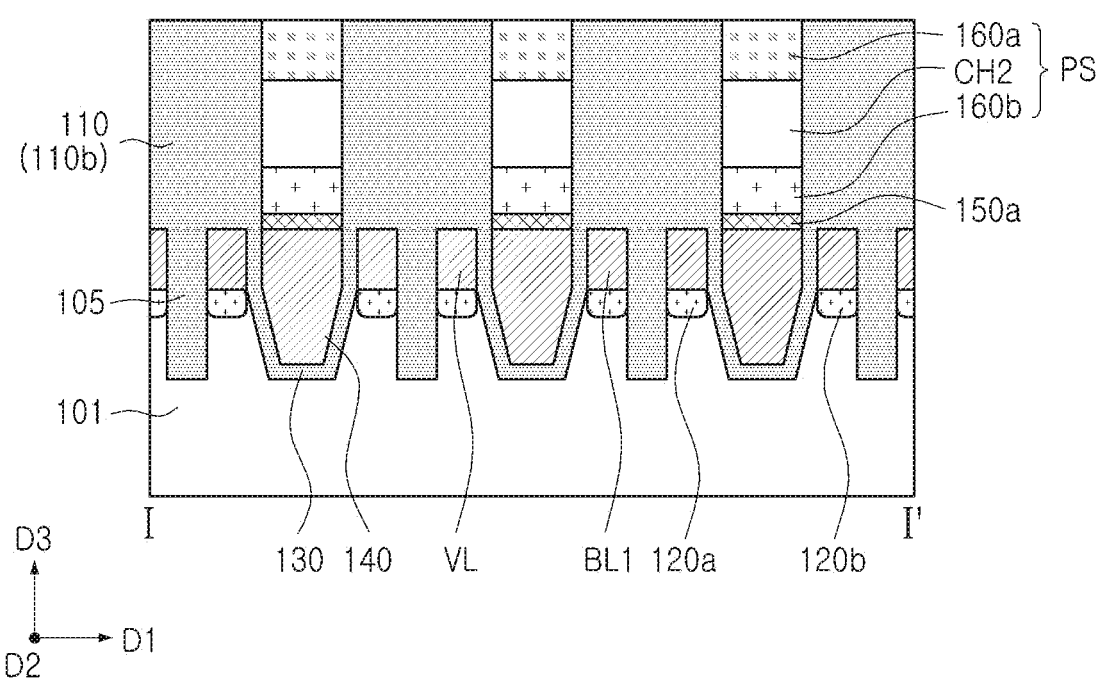
Figure 17C:
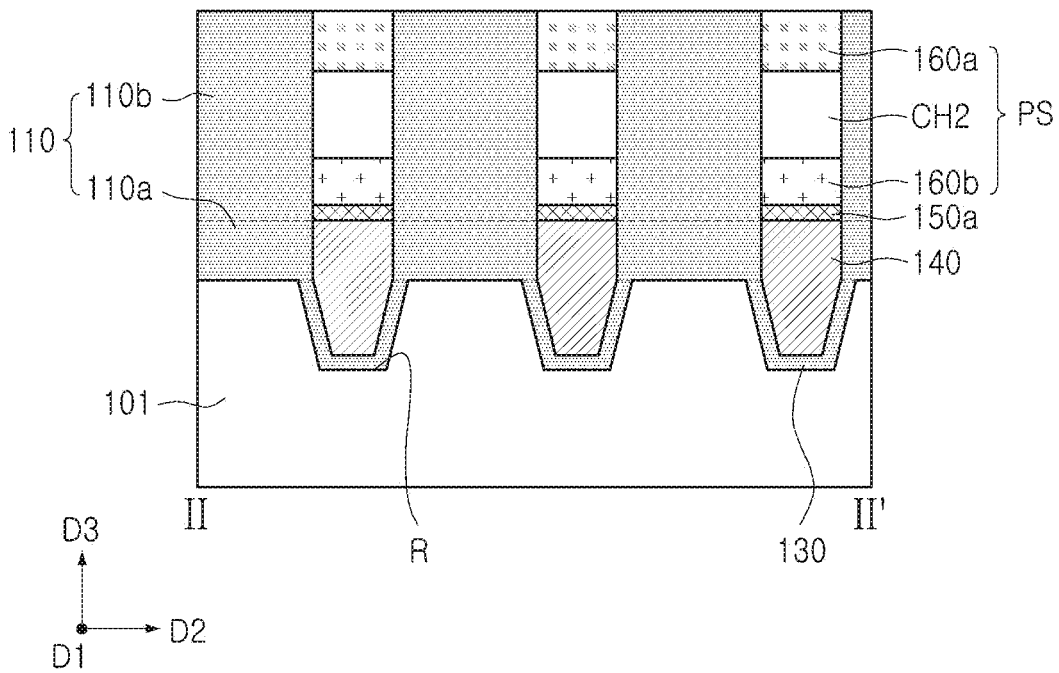

Referring to FIGS. 17A to 17C, the pillar structure PS for the second transistor may be formed in the third opening O3.

The pillar structure PS is a structure based on the same material grown in the third direction D3, but may also be formed in three stages by controlling the type of impurities for respective growth sections. In detail, the pillar structure PS is deposited using the same material, but n-type impurities are implanted in the section for the second drain region 160b, the second channel region CH2 is formed without impurities, and a required tunneling FET structure may be formed by implanting p-type impurities in a section for the source region 160a.

For example, the pillar structure PS may include a semiconductor material such as polysilicon. Alternatively, the pillar structure PS may be $CuS_2$, $CuSe_2$, $WSe_2$, $MoS_2$, $MoSe_2$, $WS_2$, IZO, ZTO, YZO, or IGZO. In a specific embodiment, the pillar structure PS may include TMD or molybdenite.

A first connection electrode layer 150a for an ohmic contact may be formed between the pillar structure PS and the first gate electrode 140. In some embodiments, when the pillar structure PS includes polysilicon, the first connection electrode layer 150a may include a silicide layer. In some embodiments, the first connection electrode layer 150a may further include a conductive barrier layer such as TiN or WN between the silicide layer and the first gate electrode 140.

Figure 18A:
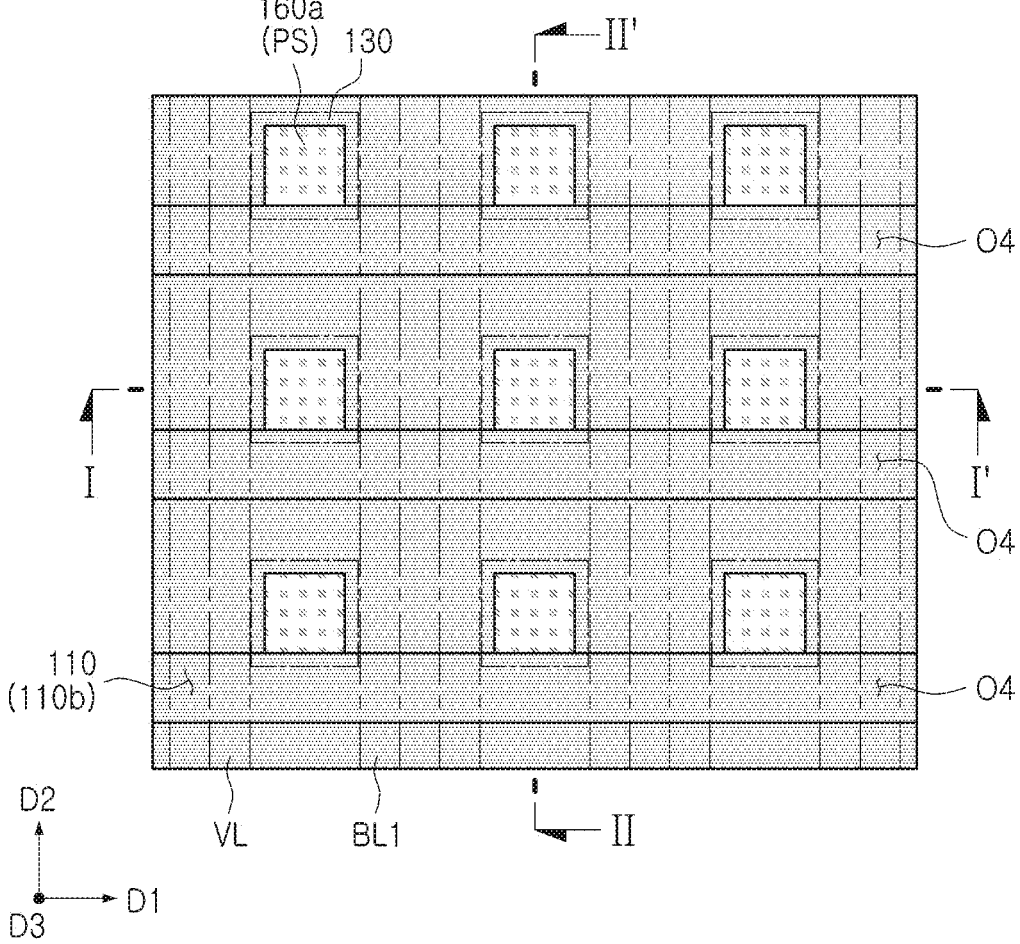
Figure 18B:
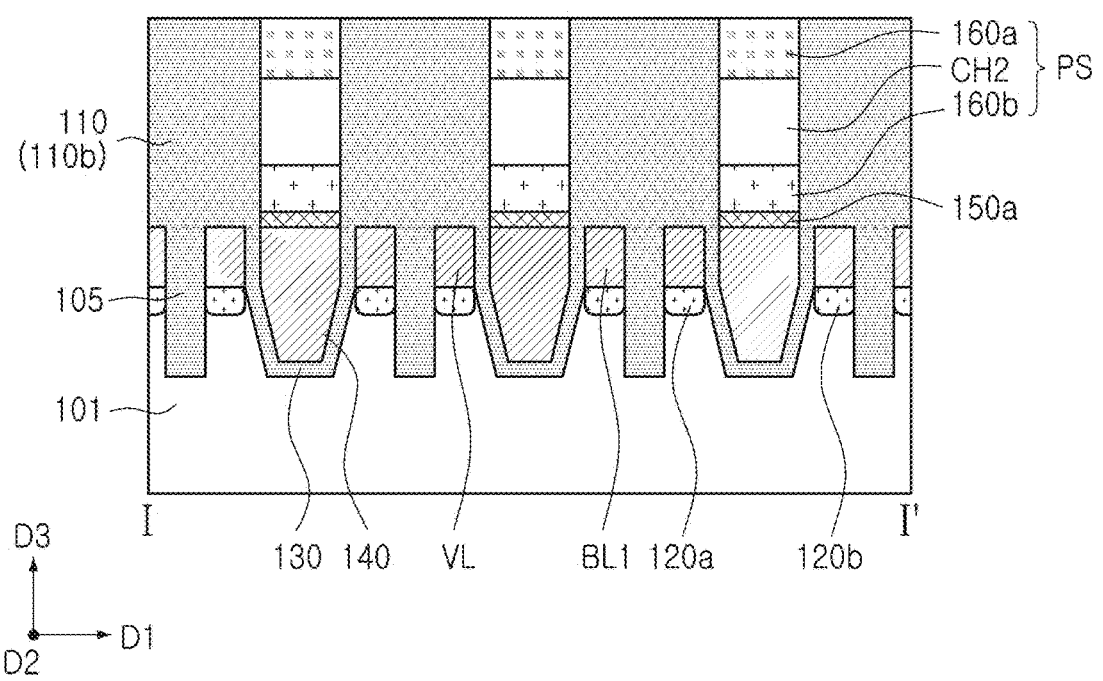
Figure 18C:
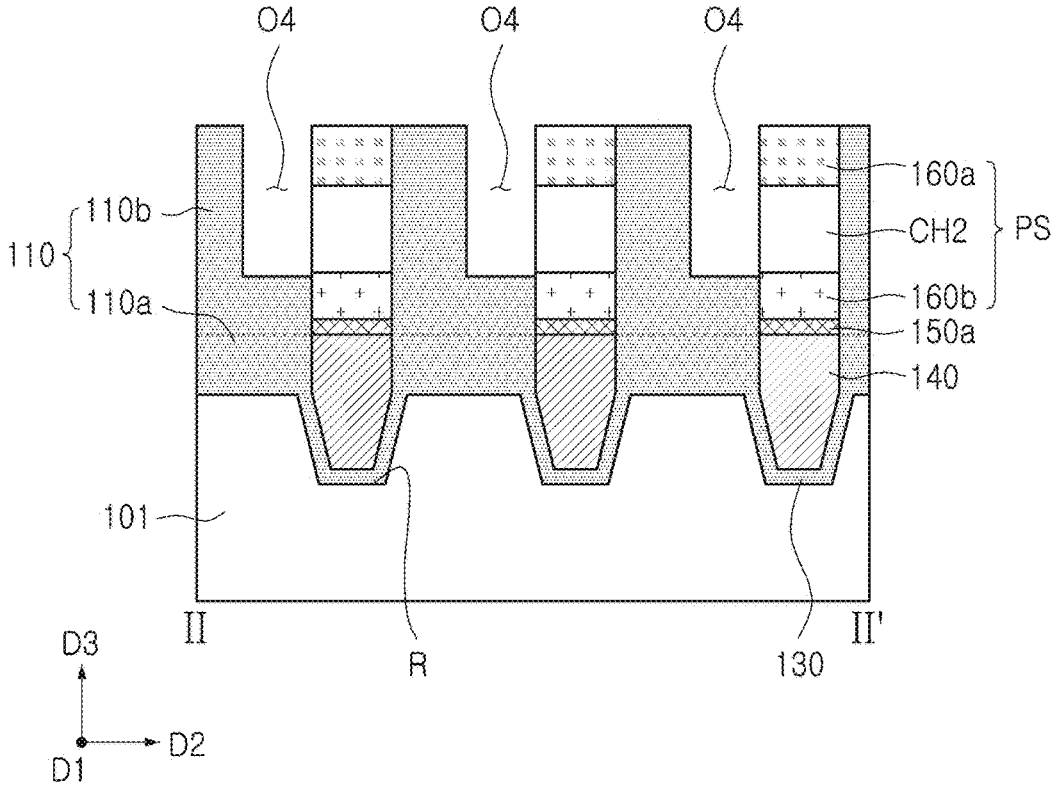

Referring to FIGS. 18A to 18C, a fourth opening O4 may be formed at one side of the pillar structure PS in the second interlayer insulating layer 110b.

The fourth opening O4 provides a region form formation of the second gate electrode 180 and the word line WL. In the present embodiment, the fourth opening O4 is additionally formed to expose one side of the second channel region CH2 of the pillar structure PS to form a second gate insulating layer 170. The depth of the fourth opening O4 may be a depth to the bottom of the second channel region CH2. Also, to form the word line WL integrated with the second gate electrode 180, the fourth opening O4 may extend in the first direction D1. For example, the second gate electrode 180 and the word line WL may be formed of a conductive material such as tungsten.

In some embodiments (refer to FIGS. 5 and 6B), the fourth opening O4 may be formed such that a portion of the second interlayer insulating layer 110b positioned on one side of the second channel region CH2 remains with a constant thickness. The portion remaining with a constant thickness may be provided as the second gate insulating layer 170. Also, in some embodiments (refer to FIGS. 7 and 8B), the fourth opening O4 may be formed to surround the pillar structure PS.

Figure 19A:
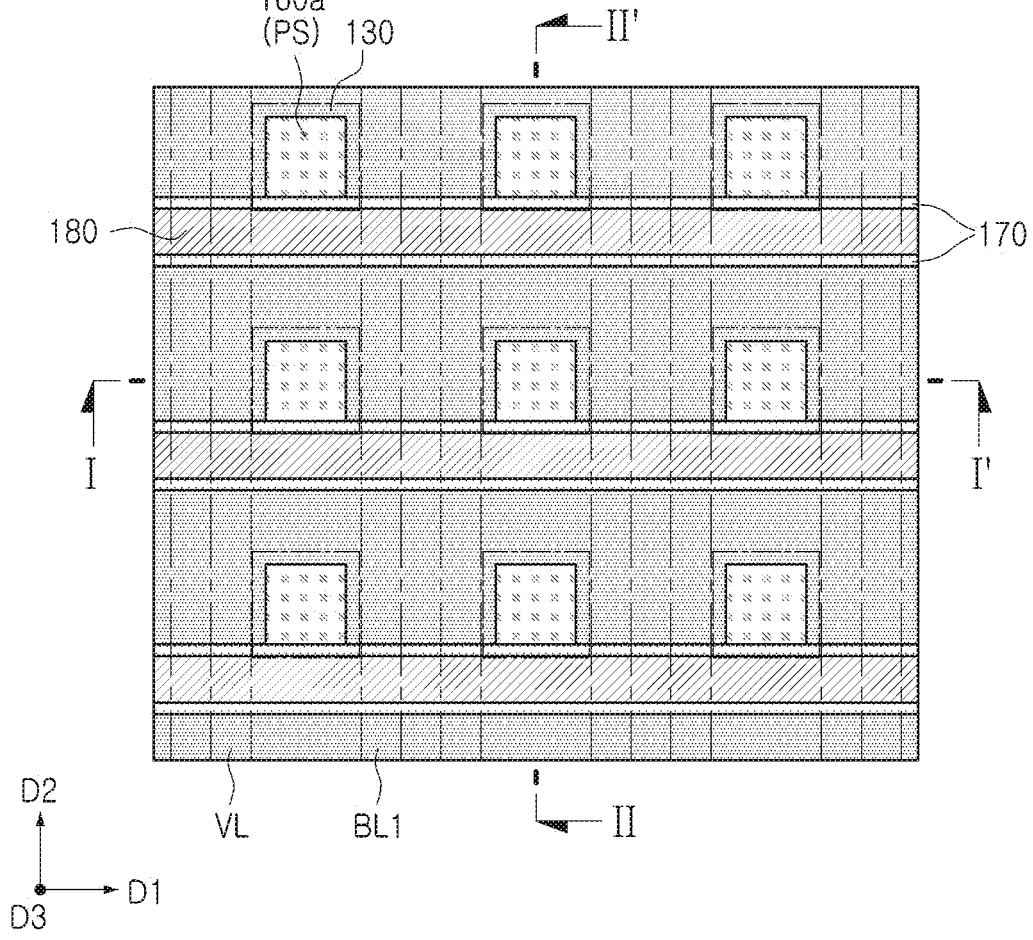
Figure 19B:
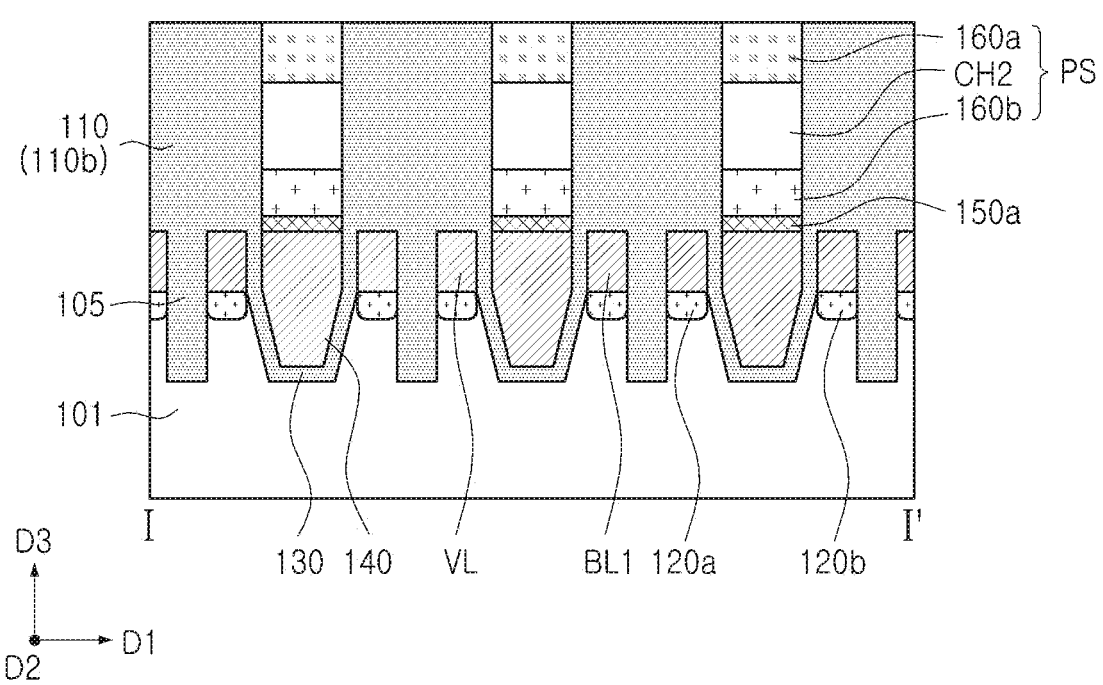
Figure 19C:
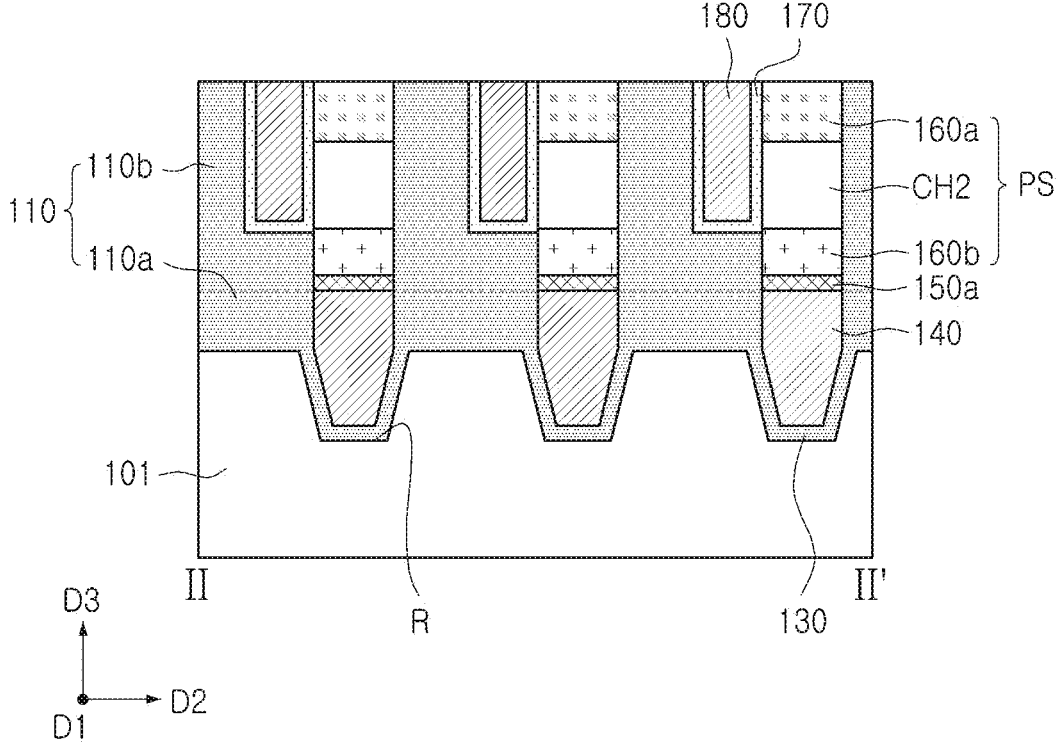

Referring to FIGS. 19A to 19C, a second gate insulating layer 170 is conformally formed on the surface of the pillar structure PS exposed by the fourth opening O4, and forms a word line WL together with the second gate electrode 180 in the fourth opening O4.

In this embodiment, the second gate insulating layer 170 may be formed of a material different from a material of the second interlayer insulating layer 110b. For example, the second interlayer insulating layer 110b may be silicon oxide, and the second gate insulating layer 170 may be at least one of silicon nitride, aluminum oxide, zirconium oxide (ZrO), hafnium oxide (HfO), lanthanum oxide (LaO), and yttrium oxide (YO).

The second gate insulating layer 170 employed in this embodiment may be formed in a structure extending from one side of the second gate electrode 180 facing the second channel region CH2 to the other side of the second gate electrode 180 across the lower surface of the second gate electrode 180. A conductive plug is formed on the second interlayer insulating layer 110b to fill the remaining space of the fourth opening O4, and a planarization process such as a CMP process is used to form the second gate electrode 180 having an upper surface flat with the upper surface of the second interlayer insulating layer 110b and the word line WL extending in the second direction D2, as illustrated in FIG. 19C.

Figure 20A:
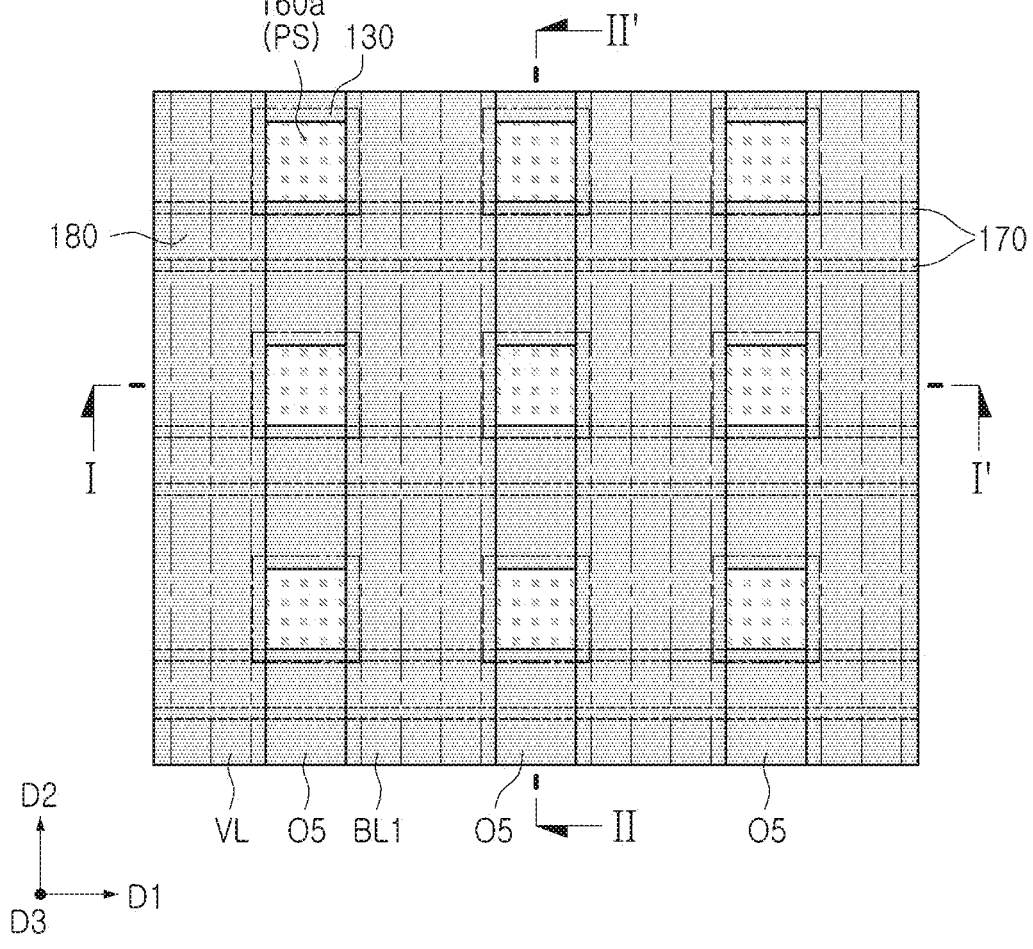
Figure 20B:
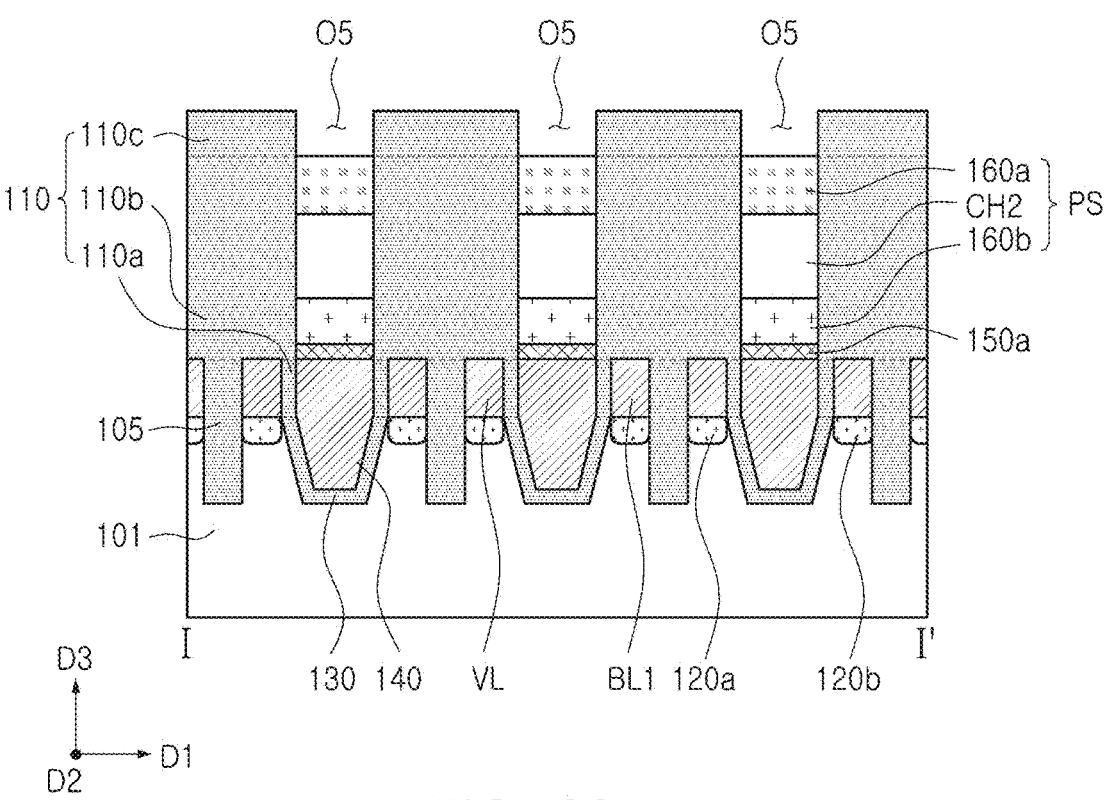
Figure 20C:
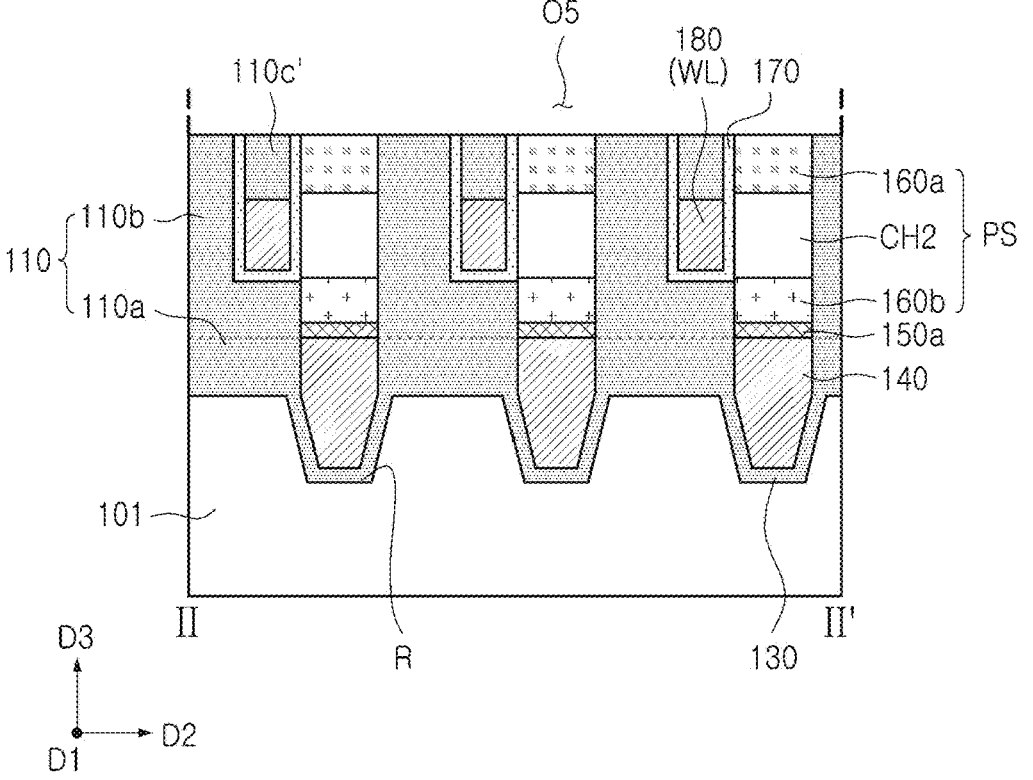

Referring to FIGS. 20A to 20C, a third interlayer insulating layer 110c is formed on the second interlayer insulating layer 110b, and a fifth opening O5 extending in the second direction D2 is formed in the third interlayer insulating layer 110c to expose the upper surface of the pillar structure PS.

First, a portion corresponding to the second source region may be removed by etching back a portion of the second gate electrode 180 and the word line WL. As in the present embodiment, a corresponding portion of the second gate insulating layer may also be removed during the present etch-back process. Accordingly, the second gate electrode 180 may have a width substantially corresponding to the height of the second channel region CH2. Next, a third interlayer insulating layer 110c may be formed on the second interlayer insulating layer 110b. In the present embodiment, the third interlayer insulating layer 110c may have a portion 110c' positioned on the second gate electrode 180 in the fourth opening O4. Next, a fifth opening O5 extending in the second direction D2 may be formed in the third interlayer insulating layer 110c to expose the upper surface of the pillar structure PS. The fifth opening O5 may define a region in which the second bit line BL2 is to be formed. The second bit line BL2 may be connected to the second source region 160a of the pillar structure PS. The process of forming the second bit line BL2 may be performed by a planarization process such as a CMP process and a process of forming a conductive plug, similar to a process of forming other conductive lines.

In the process of forming the second bit line BL2, a second connection electrode layer 150b for ohmic contact may be formed between the pillar structure PS and the second bit line BL2. In some embodiments, when the pillar structure PS includes polysilicon, the second connection electrode layer 150b may include a silicide film. In some embodiments, the second connection electrode layer 150b may include a silicide layer and a conductive barrier layer such as TiN or WN between the silicide layer and the second bit line BL2.

As set forth above, according to an example embodiment, a DRAM cell having two transistors stacked in a vertical direction is provided. In detail, the size of the cell may be scaled down by implementing the upper transistor (or the second transistor) on the gate electrode of the lower transistor (or the first transistor) as a vertical channel transistor (VCT) structure. In addition, by implementing the upper transistor as a tunneling FET (T-FET), a leakage current may be reduced when the gate of the first transistor is turned off, and a retention time of the semiconductor memory device may be increased.

While example embodiments have been illustrated and described above, it will be apparent to those skilled in the art that modifications and variations could be made without departing from the scope of inventive concepts as defined by the appended claims.

What is claimed is:

1. A semiconductor memory device comprising:

a substrate;

a plurality of first transistors on the substrate, the plurality of first transistors arranged in a first direction and a second direction, the first direction and the second direction being parallel to an upper surface of the substrate, the first direction and the second direction intersecting each other, and the plurality of first transistors each including a first source region, a first drain region, a first channel region between the first source region and the first drain region, and a first gate electrode on the first channel region;

a plurality of second transistors each including a pillar structure and a second gate electrode, the pillar structure on the first gate electrode of a corresponding one of the plurality of first transistors, the pillar structure including a second drain region, a second channel region, and a second source region sequentially stacked on the first gate electrode of the corresponding one of the plurality of first transistors, the second gate electrode on one side of the second channel region, the second drain region and the second source region having a first conductivity type impurity region and a second conductivity type impurity region, respectively;

a plurality of power lines connected to respective first source regions of the plurality of first transistors, the plurality of power lines extending in the first direction;

a plurality of first bit lines connected to respective first drain regions of the plurality of first transistors, the plurality of first bit lines extending in the first direction;

a plurality of second bit lines connected to respective second source regions of the plurality of second transistors, the plurality of second bit lines extending in the first direction; and a plurality of word lines connecting respective second gate electrodes of the plurality of second transistors, the plurality of word lines extending in the second direction.

2. The semiconductor memory device of claim 1, wherein the first channel region is provided along a surface of a recess in the upper surface of the substrate, and a portion of the first gate electrode is in the recess.

3. The semiconductor memory device of claim 1, further comprising:

a first interlayer insulating layer on the substrate, the first interlayer insulating layer surrounding the plurality of first transistors; and a second interlayer insulating layer on the first interlayer insulating layer, the second interlayer insulating layer surrounding the plurality of second transistors.

4. The semiconductor memory device of claim 3, wherein each of the plurality of first transistors further includes a first gate insulating layer between the first channel region and the first gate electrode, the first gate insulating layer includes a same material as a material of the first interlayer insulating layer.

5. The semiconductor memory device of claim 3, wherein each of the plurality of second transistors further includes a second gate insulating layer between the second channel region and the second gate electrode, the second gate insulating layer includes a same material as a material of the second interlayer insulating layer.

6. The semiconductor memory device of claim 3, wherein each of the plurality of second transistors further includes a second gate insulating layer between the second channel region and the second gate electrode, the second gate insulating layer includes a material different from a material of the second interlayer insulating layer.

7. The semiconductor memory device of claim 6, wherein the second gate electrode includes a first side surface facing the second channel region and a second side surface opposite the first side surface of the second gate electrode, the second gate insulating layer extends to a lower surface of the second gate electrode and the second side surface of the second gate electrode.

8. The semiconductor memory device of claim 1, further comprising:

a device isolation layer in the substrate, wherein the device isolation layer extends in the first direction between the plurality of first transistors.

9. The semiconductor memory device of claim 1, wherein the respective second gate electrodes of the plurality of second transistors have structures integrated with respective word lines among the plurality of word lines.

10. The semiconductor memory device of claim 1, wherein in the plurality of second transistors, the second gate electrode has a structure surrounding the second channel region.

11. The semiconductor memory device of claim 1, wherein the first source region and the first drain region respectively include a first conductivity type impurity region.

12. The semiconductor memory device of claim 1, wherein the pillar structure includes a semiconductor material.

13. The semiconductor memory device of claim 1, further comprising:

first silicide layers between respective pillar structures of the plurality of second transistors and respective first gate electrodes of the plurality of first transistors; and second silicide layers between the plurality of second bit lines and the respective pillar structures, wherein in the plurality of second transistors, the pillar structure includes polysilicon.

14. The semiconductor memory device of claim 1, wherein the pillar structure includes at least one of $CuS_2$, $CuSe_2$, $WSe_2$, $MoS_2$, $MoSe_2$, $WS_2$, IZO, ZTO, YZO, and IGZO.

15. A semiconductor memory device comprising:

a substrate; and a plurality of memory cells on the substrate, wherein each of the plurality of memory cells includes a first transistor on the substrate and a second transistor on the first transistor, the first transistor includes a first source region, a first drain region, a first channel region between the first source region and the first drain region, a first gate electrode on the first channel region, and a first gate insulating layer between the first channel region and the first gate electrode, and the second transistor includes a pillar structure on the first gate electrode of the first transistor, the pillar structure includes a second drain region, a second channel region, and a second source region sequentially stacked on the first gate electrode of the first transistor, the second transistor includes a second gate electrode on one side of the second channel region, and a second gate insulating layer between the second channel region and the second gate electrode, and the second drain region and the second source region have a first conductivity type impurity region and a second conductivity type impurity region, respectively.

16. The semiconductor memory device of claim 15, wherein the first channel region has a three-dimensional structure.

17. The semiconductor memory device of claim 15, further comprising:

a connection electrode layer between the second drain region of the pillar structure and the first gate electrode.

18. The semiconductor memory device of claim 15, further comprising:

a first interlayer insulating layer on the substrate; and a second interlayer insulating layer on the first interlayer insulating layer, wherein the first interlayer insulating layer surrounds the first transistor, and the second interlayer insulating layer surrounds the second transistor.

19. The semiconductor memory device of claim 18, wherein a material of the first gate insulating layer is different from a material of the first interlayer insulating layer.

20. The semiconductor memory device of claim 19, wherein the first gate insulating layer includes at least one of silicon nitride, aluminum oxide, zirconium oxide (ZrO), hafnium oxide (HfO), lanthanum oxide (LaO), and yttrium oxide (YO).

* * * * *